(12) United States Patent
Gruning-Von Schwerin

(10) Patent No.: US 7,312,492 B2
(45) Date of Patent: Dec. 25, 2007

(54) METHOD FOR FABRICATING A DRAM MEMORY CELL ARRANGEMENT HAVING FIN FIELD EFFECT TRANSISTORS AND DRAM MEMORY CELL

(75) Inventor: Ulrike Gruning-Von Schwerin, Munich (DE)

(73) Assignee: Infineon Technologies AG, Munich (DE)

(*) Notice: Subject to any disclaimer, the term of this patent is extended or adjusted under 35 U.S.C. 154(b) by 93 days.

(21) Appl. No.: 11/169,812

(22) Filed: Jun. 29, 2005

(65) Prior Publication Data

US 2006/0006446 A1 Jan. 12, 2006

(30) Foreign Application Priority Data

Jun. 29, 2004 (DE) ...................... 10 2004 031 385

(51) Int. Cl.
*H01L 27/108* (2006.01)
*H01L 29/76* (2006.01)
*H01L 29/94* (2006.01)
*H01L 31/119* (2006.01)

(52) U.S. Cl. ...................... 257/301; 257/302
(58) Field of Classification Search ................ 257/347, 257/301, 302
See application file for complete search history.

(56) References Cited

U.S. PATENT DOCUMENTS 4,751,557 A * 6/1988 Sunami et al. ................ 257/68

| 4,811,067 A * | 3/1989 | Fitzgerald et al. .......... 257/301 |
| 6,255,683 B1 * | 7/2001 | Radens et al. .............. 257/301 |
| 6,437,388 B1 * | 8/2002 | Radens et al. .............. 257/301 |

FOREIGN PATENT DOCUMENTS

| DE | 103 61 695 | 12/2003 |
| EP | 1 017 095 | 7/2000 |

* cited by examiner

*Primary Examiner*—Jerome Jackson
*Assistant Examiner*—Anthony Ho
(74) *Attorney, Agent, or Firm*—Dicke, Billig & Czaja PLLC

(57) ABSTRACT

The invention relates to the fabrication of DRAM memory cell arrangements having fin field effect transistors and curved channel field effect transistors. The FinFETs and CFETs are formed in a manner oriented to semiconductor fins arranged in cell rows. Within the cell rows, the semiconductor fins are spaced apart from one another by cell insulator structures. Adjacent cell rows are spaced apart from one another by striplike trench insulator structures. The semiconductor fins are in each case recessed in one or in two inner trench sections by means of gate trenches which extend from a longitudinal side of the respective semiconductor fin to the opposite longitudinal side. By isotropically etching the oxide of the trench insulator structures, pockets (fin trenches) are formed, in a self-aligned manner with respect to the gate trenches in the trench insulator structures and filled with a gate conductor material. Vertical gate electrode sections emerge without etching back from the deposited gate conductor material. In conjunction with trench capacitors as cell insulator structures, an improved decoupling and insulation of the trench capacitors from word lines led above the trench capacitors are achieved.

11 Claims, 30 Drawing Sheets

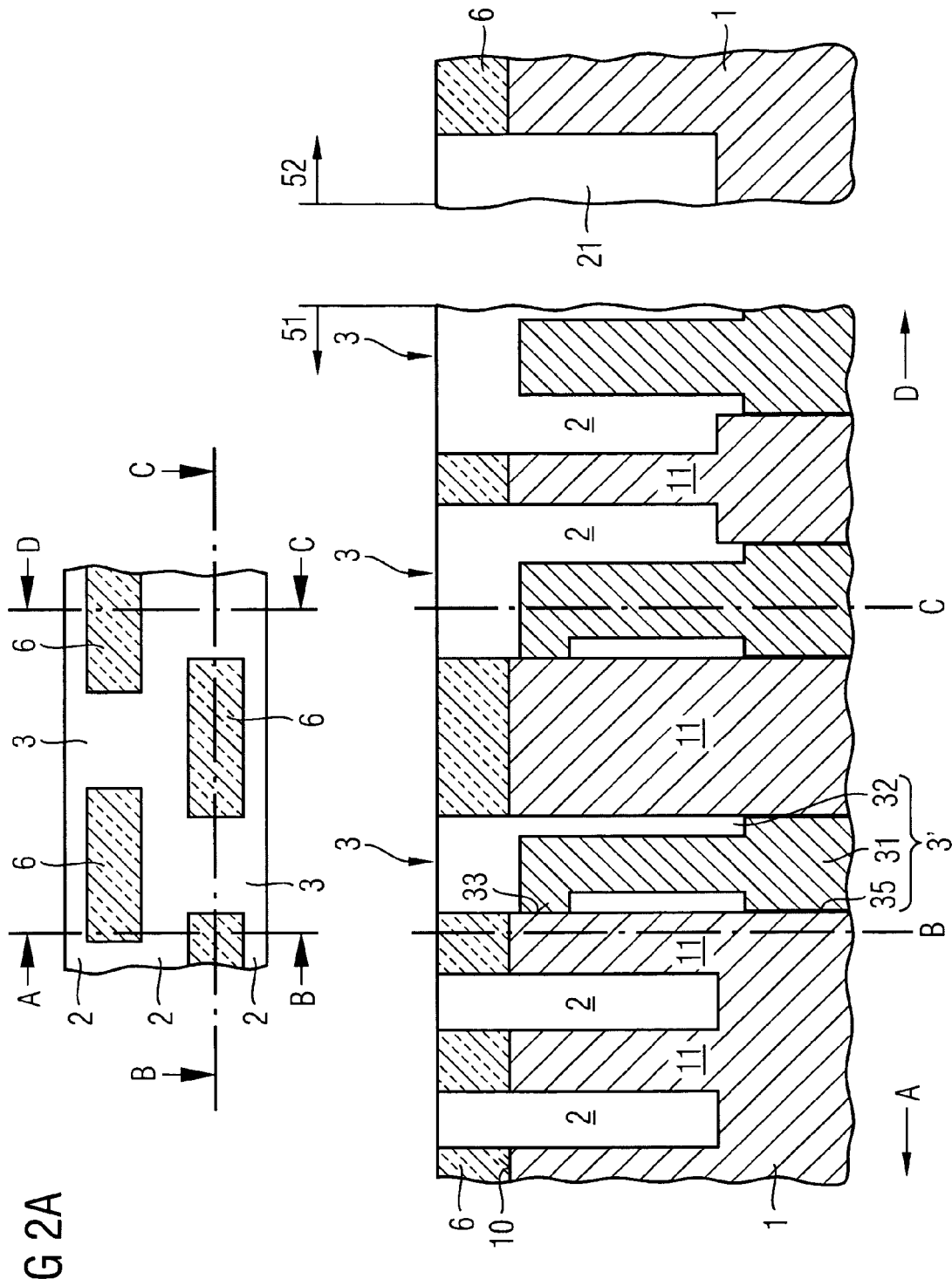

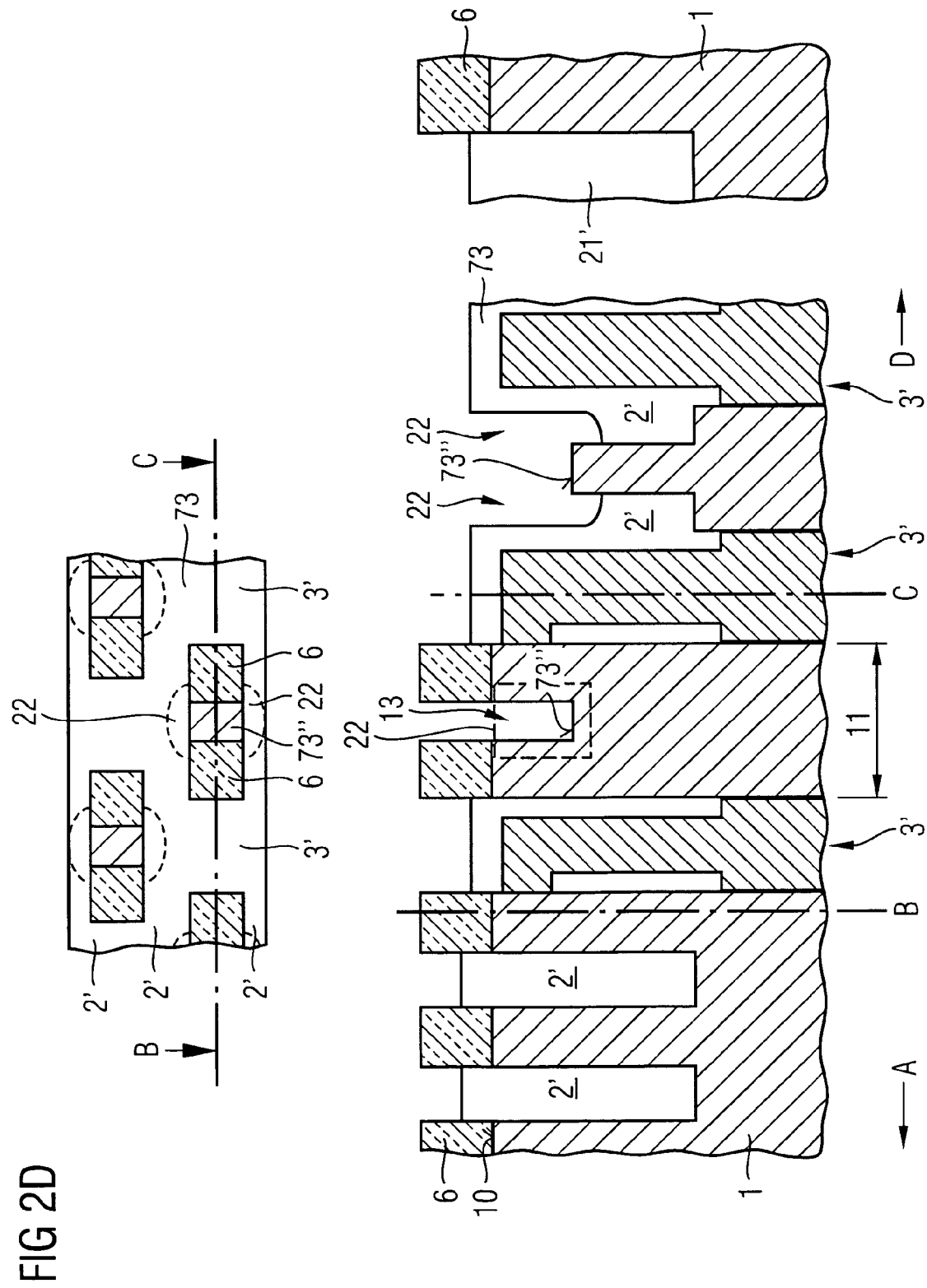

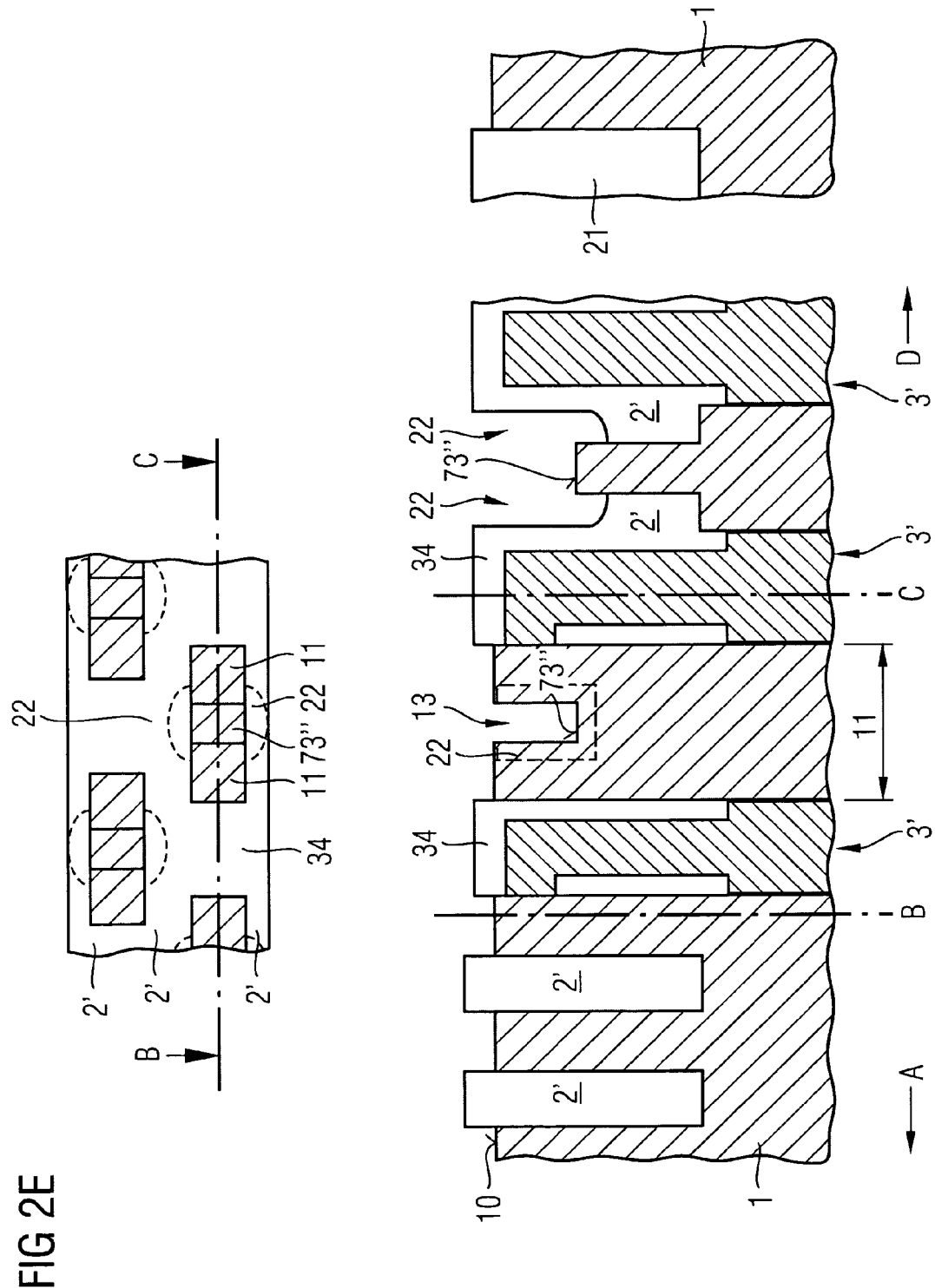

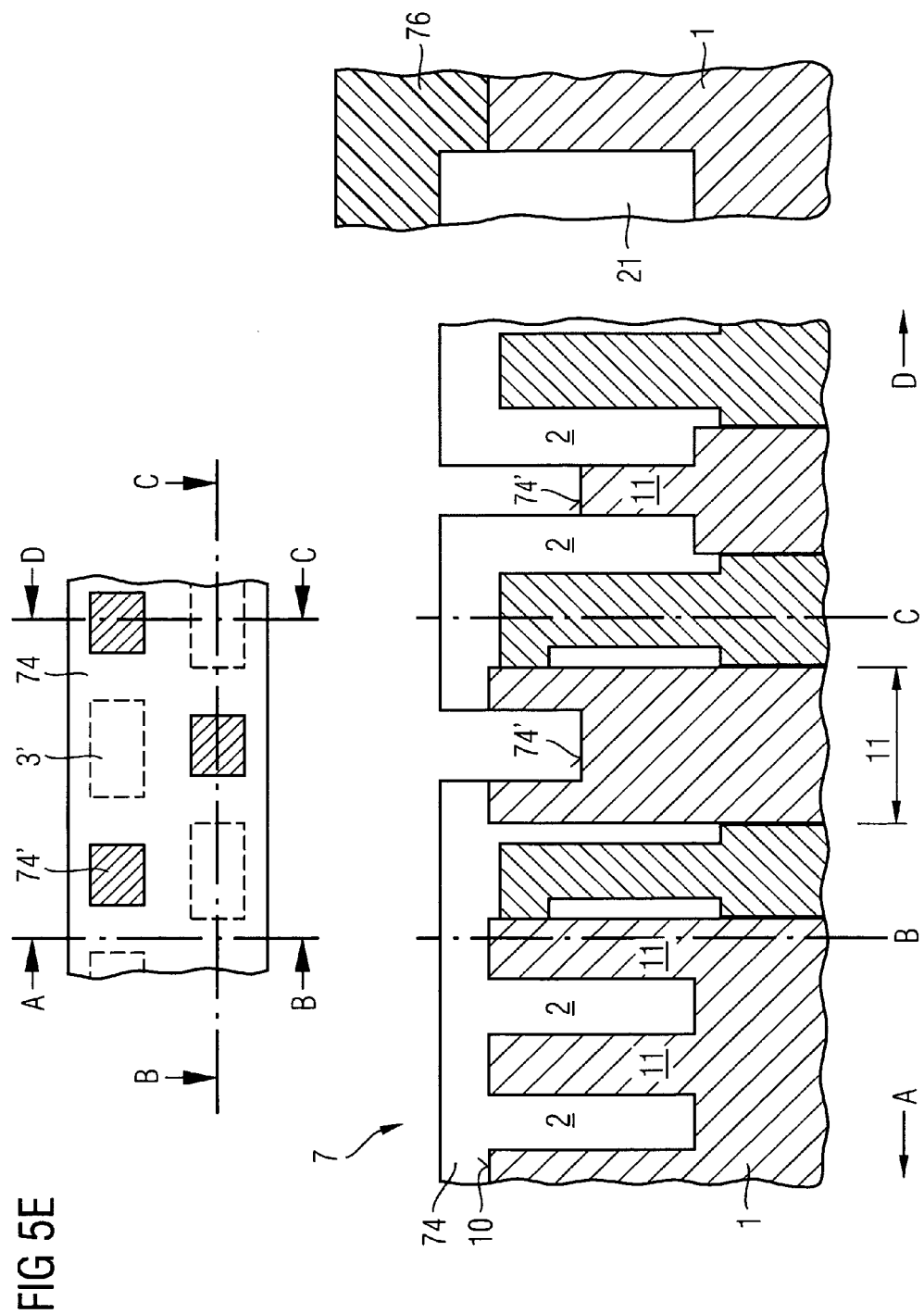

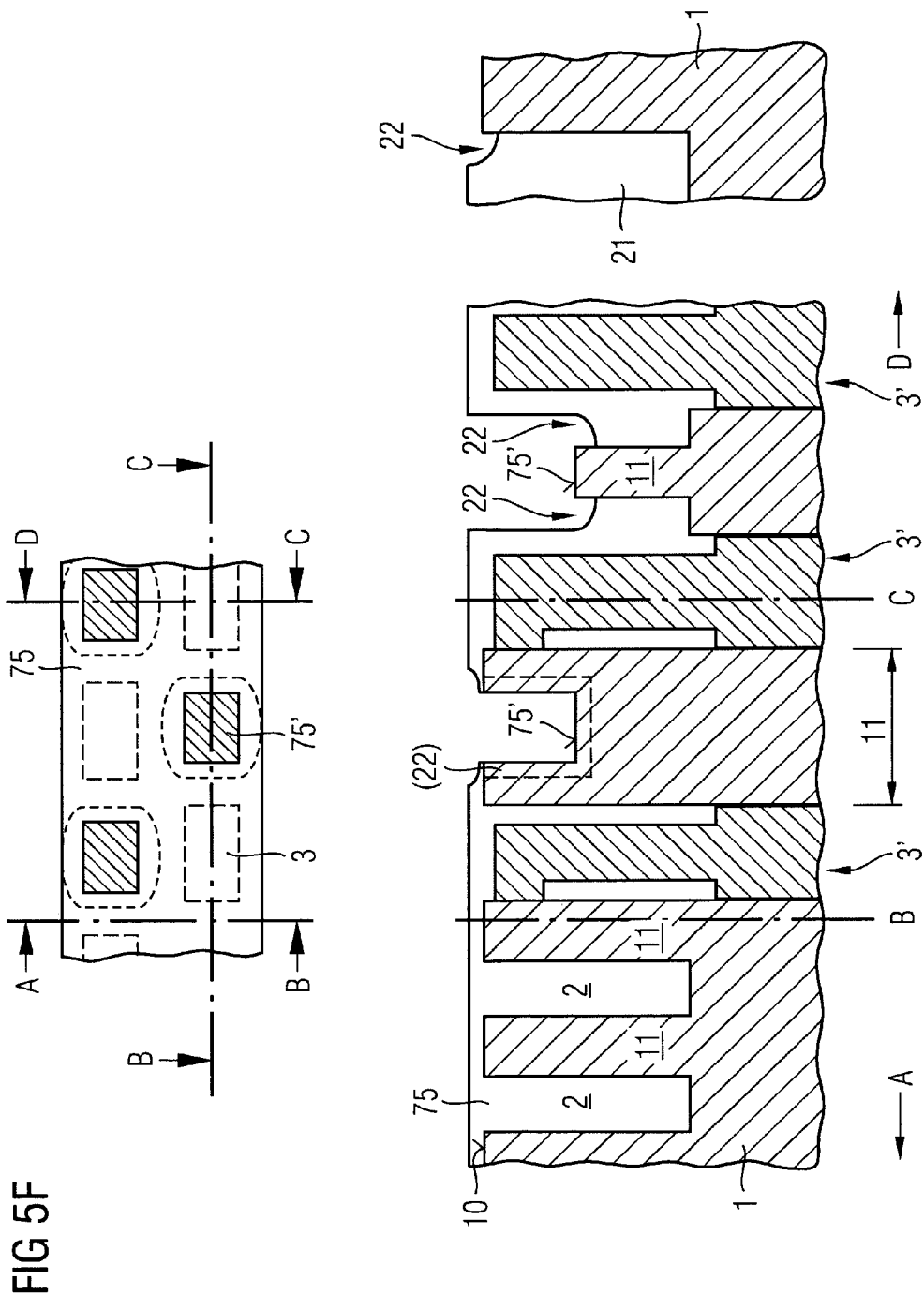

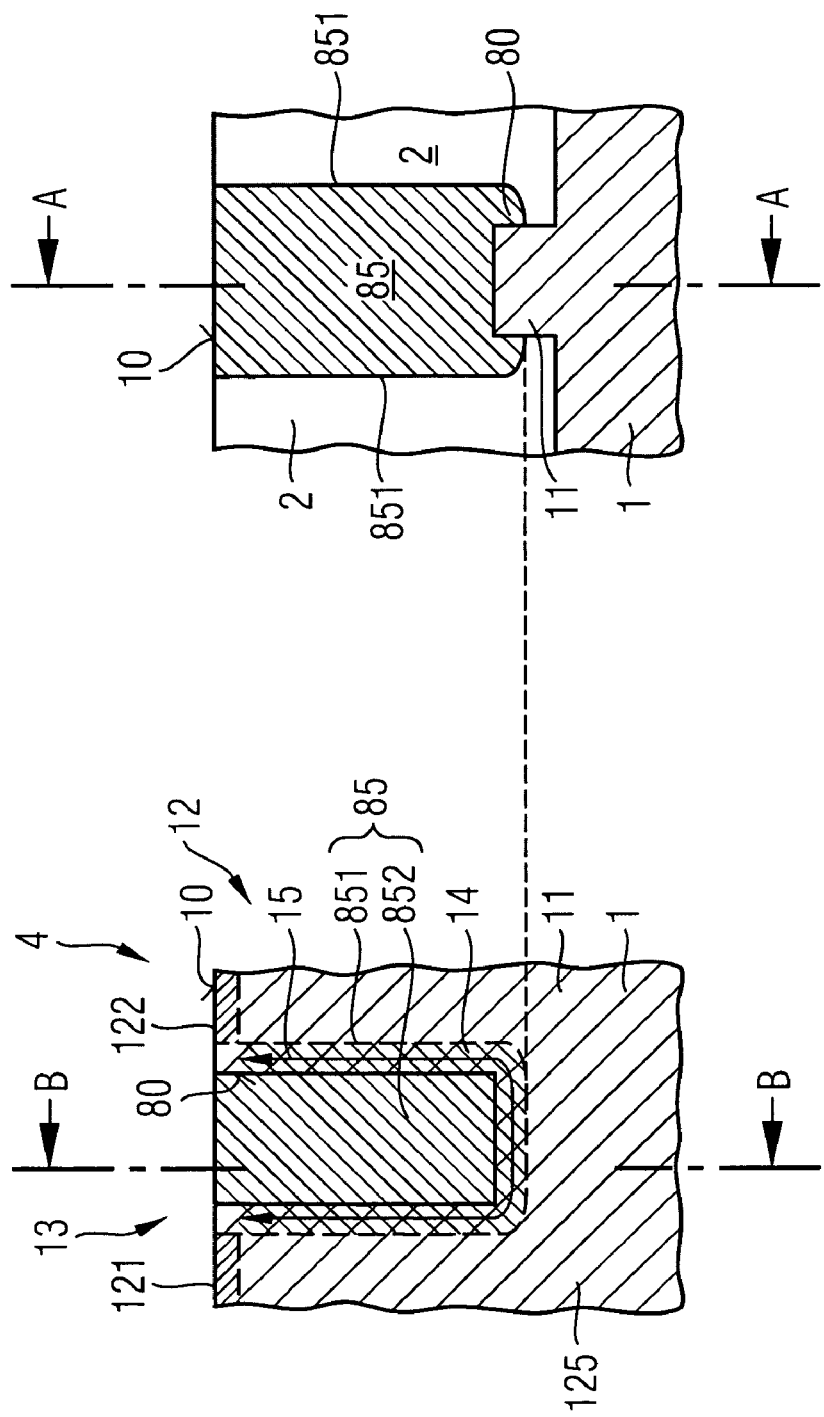

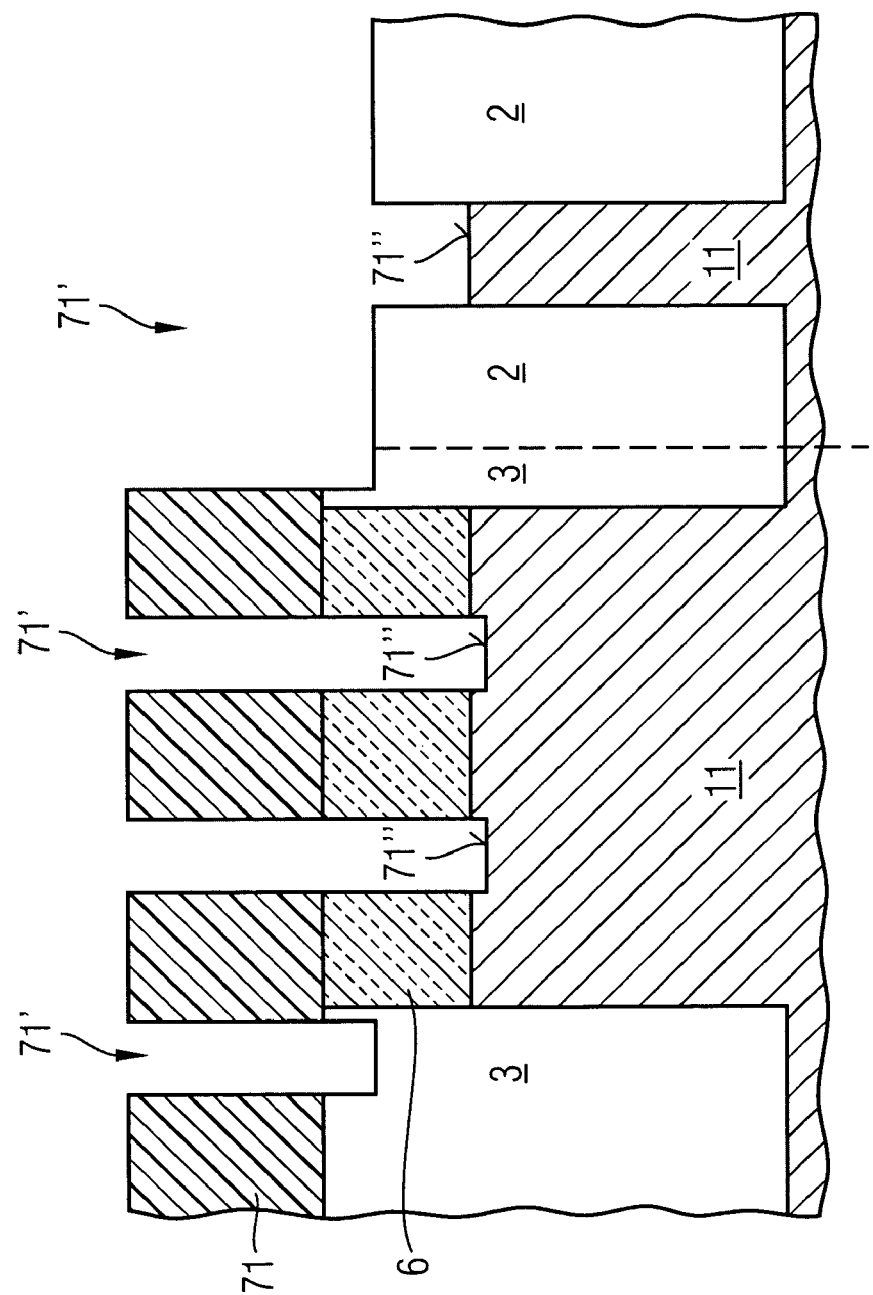

US 7,312,492 B2

METHOD FOR FABRICATING A DRAM MEMORY CELL ARRANGEMENT HAVING FIN FIELD EFFECT TRANSISTORS AND DRAM MEMORY CELL

CROSS-REFERENCE TO RELATED APPLICATIONS

This Utility Patent Application claims priority to German Patent Application No. DE 10 2004 031 385.7, filed on Jun. 29, 2004, which is incorporated herein by reference.

FIELD OF THE INVENTION

The invention relates to a method for fabricating DRAM memory cell arrangements having fin field effect transistors (FinFETs) and DRAM memory cell arrangements having curved channel fin field effect transistors (CFETs) and also to a DRAM memory cell arrangement having CFETs.

BACKGROUND

Memory cells of dynamic random access memories (DRAMs) comprise a storage capacitor for storing an electrical charge that characterizes an information content of the memory cell, and a selection transistor for addressing the storage capacitor. The selection transistor is formed as a field effect transistor in a semiconductor substrate. For the channel length of the selection transistor, a lower limit arises below which the insulation properties of the selection transistor in the turned-off state, corresponding to the nonaddressed state of the memory cell, are inadequate. The lower limit of the effective channel length Leff limits the scalability of planar transistor cells (PTC) with a selection transistor formed horizontally with respect to a substrate surface of the semiconductor substrate.

Cell arrangements with vertical transistor cells (VTC) have been described for memory cell arrangements having trench capacitors as storage capacitors. In this case, the source/drain regions of the selection transistor, in the semiconductor substrate, are oriented essentially vertically with respect to the substrate surface and are formed one above the other between the substrate surface and an upper edge of the trench capacitor embodied in the depth of the semiconductor substrate. In the addressed state of the memory cell, a channel controlled by a gate electrode of the selection transistor is formed between the two source/drain regions perpendicularly to the substrate surface. The channel width Weff arises in a manner dependent on the smallest feature size F that can be produced by means of a lithographic patterning method. The channel length Leff is dependent on the depth in which the lower source/drain region or a lower edge of the gate electrode is formed.

Disadvantages of such vertical transistor cells are the complicated integration thereof in memory cells with stacked capacitors and also, in the case of integration in memory cells with trench capacitors, the increase in the aspect ratio of a hole trench for the formation of trench capacitor and vertical transistor cell. What are furthermore disadvantageous are the parasitic action of the gate electrode of one selection transistor on the selection transistors adjacent to the selection transistor and also the switch-on/off current Ion that is limited in magnitude.

In other vertical memory cells with a vertical transistor structure, a body region formed between the two source/drain regions is completely surrounded by the gate electrode (surrounded gate vertical transistor cell, SGT). The first source/drain region of the selection transistor is formed in the base region of a semiconductor fin. A second source/drain region is provided at the upper edge of the semiconductor fin. The gate electrode extends along the four side walls of the semiconductor fin. The effective channel length Leff of such a vertical transistor structure results from the height of the semiconductor fin. The effective channel width Weff corresponds to the contour of the fin, at least one side length of the semiconductor fin arising in a manner dependent on the minimum feature size F. The total effective channel width correspondingly amounts to 2 F to 3 F. The integration of surrounded gate transistor cells in memory cells with stacked capacitors is complicated. In the case of integration in memory cells with trench capacitors, the high aspect ratios established in the course of processing at the hole trench and also the resultant restrictions with regard to the processing are disadvantageous.

In the case of recess channel field effect transistors (recess channel array transistor) the two source/drain regions are arranged in a horizontal plane with respect to the substrate surface. The gate electrode is provided in a recess trench introduced into the semiconductor substrate between the two source/drain regions of the field effect transistor. The effective channel length Leff results from the distance between the two source/drain regions and also the depth to which the recess trench is introduced into the semiconductor substrate. The effective channel width Weff corresponds to the minimum feature size F.

The switch-on/off current Ion/off is disadvantageously limited by the still restricted effective channel width. The integration of recess channel FETs in memory cell arrangements with a high memory cell density is made more difficult by the required alignment of the gate electrodes with respect to the recess trenches, for instance if the gate electrodes and the recess trenches are in each case patterned in the course of a dedicated photolithographic method step. In contrast to FinFETs or SGT transistor cells, the active zone is not shielded from adjacent memory cells by the gate electrode, so that a parasitic punchthrough of the potential of a gate electrode of one transistor structure to the transistor structures adjacent to said one transistor structure disadvantageously occurs.

An arrangement for memory cells having trench capacitors and selection transistors with a gate electrode recessed into the semiconductor substrate is described in U.S. Pat. No. 5,945,707.

In order to form fin field effect transistors (FinFETs), a semiconductor fin is formed in each case between two source/drain regions—formed horizontally with respect to the wafer surface—in the semiconductor substrate. A gate electrode structure adjoining the semiconductor fin on three sides is provided transversely with respect to the semiconductor fin. The effective channel length Leff of the fin field effect transistor is determined by the length of that section of the semiconductor fin which is enveloped by the gate electrode, in accordance with the minimum feature size F. The effective channel width Weff is determined from the height of the semiconductor fin, or the depth to which the semiconductor substrate is pulled back between the two source/drain regions on both sides of the semiconductor fin.

German patent application DE10361695.0, incorporated herein by reference, describes a curved channel field effect transistor (curved FET, CFET). The CFET is formed in a semiconductor fin formed from the semiconductor substrate. The two source/drain regions of the CFET are formed as doped zones at mutually opposite ends of the semiconductor fin and adjoining a substrate surface of the semiconductor substrate. Between the two source/drain regions, the semiconductor fin is recessed by means of a groove etching, whereby the channel length of the CFET results in accordance with the channel length of a recess channel FET. The gate electrode extends, in a manner insulated from the semiconductor fin by a gate dielectric, in sections along at least one of the longitudinal sides of the semiconductor fin. In accordance with the method for fabricating a memory cell arrangement having CFETs as selection transistors that is described in the above application, the semiconductor fins are arranged one after the other in the longitudinal direction to form cell rows in a manner electrically insulated from one another in each case. The gate electrodes of CFETs arranged in regard to a cell row are in each case sections of buried word lines that are provided in word line trenches running below the substrate surface along the semiconductor fins. In this case, the word lines are embedded in dielectric material that fills the word line trenches.

In memory cell arrangements having CFETs with gate electrode sections arranged on both sides of the semiconductor fin, a strand of two differently driven word lines is in each case situated opposite each other in the same word line trench. A high memory cell density leads to a high parasitic coupling capacitance between the word line strands running within the same word line trench.

SUMMARY

The invention relates to the fabrication of DRAM memory cell arrangements having fin field effect transistors and curved channel field effect transistors. The FinFETs and CFETs are formed in a manner oriented to semiconductor fins arranged in cell rows. Within the cell rows, the semiconductor fins are spaced apart from one another by cell insulator structures. Adjacent cell rows are spaced apart from one another by striplike trench insulator structures. The semiconductor fins are in each case recessed in one or in two inner trench sections by means of gate trenches which extend from a longitudinal side of the respective semiconductor fin to the opposite longitudinal side. By isotropically etching the oxide of the trench insulator structures, pockets (fin trenches) are formed, in a self-aligned manner with respect to the gate trenches in the trench insulator structures and filled with a gate conductor material. Vertical gate electrode sections emerge without etching back from the deposited gate conductor material. In conjunction with trench capacitors as cell insulator structures, an improved decoupling and insulation of the trench capacitors from word lines led above the trench capacitors are achieved.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 6 illustrates a cross section through an exemplary embodiment of a CFET according to the invention.

DETAILED DESCRIPTION

Figure 1:
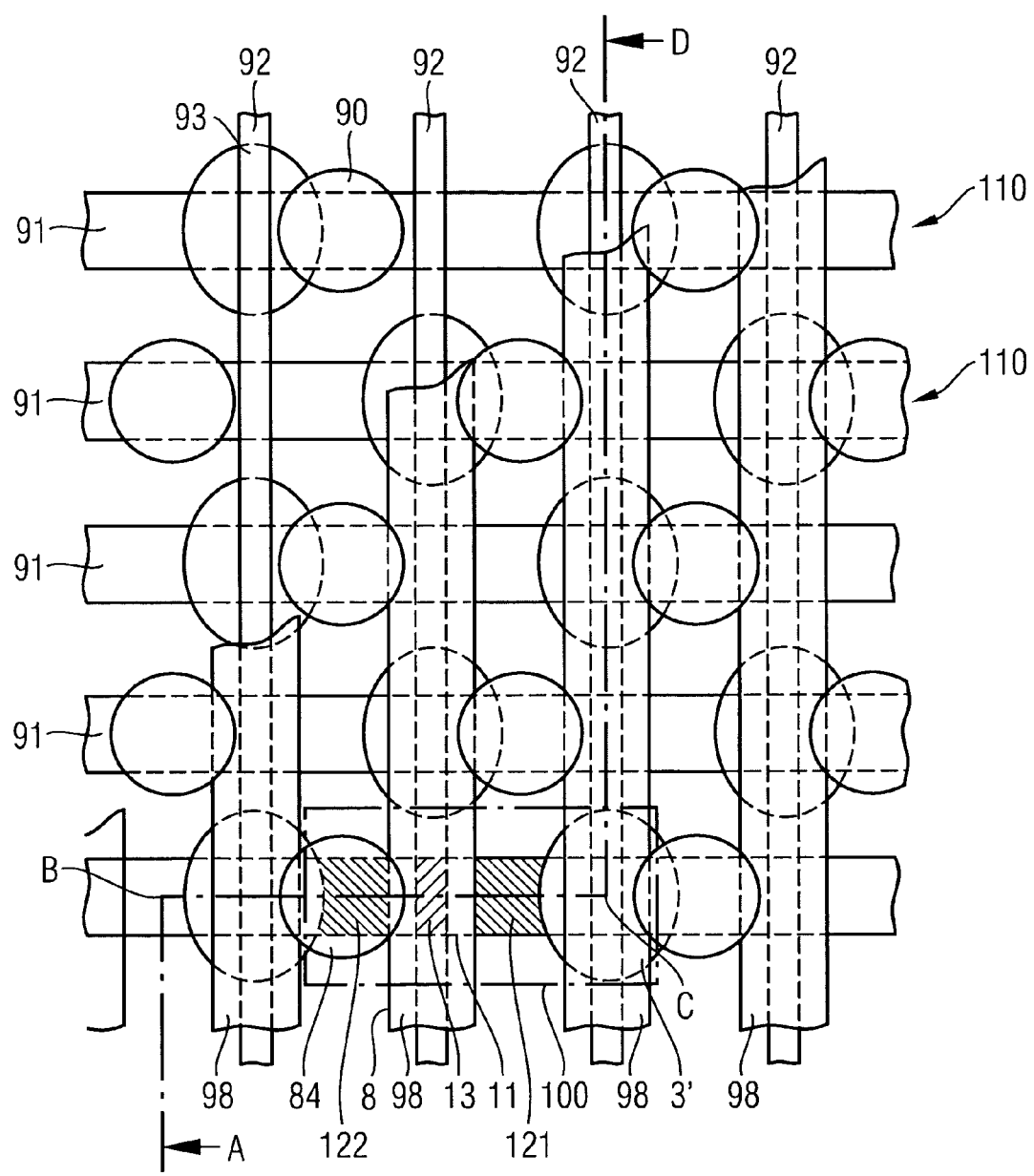
FIG. 1 illustrates a plan view of a DRAM cell array with a section line A-D corresponding to FIGS. 2 to 5.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a method for fabricating a DRAM memory cell arrangement having FinFETs or CFETs by means of which adjacent word lines, for the addressing of the memory cells, are decoupled well from one another and in the case of which the alignment of gate electrode structures with respect to a body region of the respective CFET or FinFET is facilitated. The invention encompasses a field effect transistor for a DRAM transistor array having CFETs with gate electrode sections that are self-aligned with respect to a gate trench etching.

In one embodiment, in accordance with a method according to the invention for fabricating fin field effect transistors and curved channel fin field effect transistors for DRAM memory cell arrangements, a semiconductor substrate is provided. Striplike, parallel trench insulator structures and also cell insulator structures are introduced into the semiconductor substrate. In this case, cell rows are formed from the semiconductor substrate between in each case two trench insulator structures. The cell insulator structures are in each case provided within the cell rows at the spacing of a cell length. By means of the cell insulator structures, a cell row is in each case subdivided into a plurality of semiconductor fins formed from the semiconductor substrate. The trench insulator structures and the cell insulator structures may be formed in a different order or simultaneously.

A hole mask is formed, which covers at least the trench insulator structures and also in each case at least the two outer mask sections of the semiconductor fins that adjoin the cell insulator structures. In each case at least one inner trench section of the semiconductor fins that is formed between the two outer mask sections is uncovered through the openings in the hole mask.

In this case, the openings in the hole mask extend from one trench insulator structure adjoining the semiconductor fin as far as the opposite adjoining trench insulator structure.

Sections of the trench insulator structures that in each case adjoin the trench sections of the respective semiconductor fins are uncovered and pulled back. In this case, pockets are formed in the trench insulator structures in each case on both sides adjoining the uncovered sections of the semiconductor fins.

In order to form gate conductor structures, conductive material is deposited, the pockets being filled with the conductive material. The conductive material is patterned to form gate conductor structures, word lines running perpendicular to the cell rows being formed. The word lines form, in sections, gate electrodes of the fin field effect transistors formed in the semiconductor fins.

The uncovering and pulling back of the sections of the trench insulator structures that in each case adjoin the trench sections of the semiconductor fins may be effected simultaneously or progressively in the same process step, for instance by simultaneous isotropic etching back of the hole mask and of the trench insulator sections.

The uncovering and pulling back of sections of the trench insulator structures that in each case adjoin the trench sections of the semiconductor fins may also be effected successively, for instance by isotropic etching back of the hole mask and subsequent anisotropic etching of the trench insulator structures or by the introduction of gate trenches into the trench sections of the semiconductor fin, vertical sidewalls of the trench insulator structures being uncovered, and subsequent isotropic etching of the trench insulator structures from the gate trenches. In the third alternative, the fin field effect transistors are always formed as CFETs.

The pockets that are in each case situated opposite one another at a semiconductor fin and have emerged from the pulling back of the trench insulator structures correspond to fin trenches in accordance with conventional methods for fabricating fin field effect transistors.

According to the invention, the pockets are formed in a self-aligned manner with respect to the trench sections of the semiconductor fin corresponding to the body regions of the fin field effect transistors.

In conventional methods, firstly the trench insulator structures are pulled back as far as the lower edge of the gate electrodes to be formed. The material of the gate conductor structures is deposited areally and subsequently patterned. Between the gate conductor structures, the material of the gate conductor structures is to be removed. The gate conductor structure is overetched in this case in order to avoid the formation of disturbing conductive structures (poly stringers) on vertical sidewalls of the semiconductor fin in the region of the source/drain regions and in order to avoid short circuits between mutually adjacent gate conductor structures. According to the invention, the material of the gate conductor structure, below the substrate surface, is exclusively deposited in the region of the buried sections of the gate conductor structures. The need to pull back buried sections of the gate conductor structure below an upper edge of the semiconductor fin is therefore advantageously obviated.

In an advantageous manner, the depth to which the buried sections of the gate electrodes extend is predetermined by a well-controllable etching step with regard to the trench insulator structure and the process control is thus improved.

The method can be used both for forming DRAM memory cell arrangements with stacked capacitors and for forming DRAM memory cell arrangements with trench capacitors.

For a memory cell arrangement in the checkerboard layout, precisely one fin field effect transistor is formed in each semiconductor fin. In the checkerboard layout, a semiconductor fin comprises the two outer mask sections adjoining the cell insulator structures, in which sections the hole mask is situated atop, and also precisely one inner trench section delimited by the outer mask sections, which is not covered by the hole mask.

In layouts which provide a common bit contact for in each case two memory cells, for instance in a memory cell arrangement in the MINT or stack layout, two fin field effect transistors are formed in each semiconductor fin. In a stack layout, for instance, a semiconductor fin comprises the two outer mask sections adjoining the cell insulator structures and also an inner mask section, which are in each case covered by the hole mask. In each case one of two trench sections above which the hole mask is opened is fashioned between in each case one of the two outer mask sections and the inner mask section.

According to a first embodiment of the method according to the invention, the pulling back of the trench insulator structures is preceded by the introduction of gate trenches into the semiconductor fins, the sections of the trench insulator structures that adjoin the gate trenches being uncovered for an isotropic etching. Curved channel field effect transistors (CFETs) are formed by the introduction of the gate trenches.

According to a second embodiment of the method according to the invention, the hole mask is pulled back before or simultaneously with the pulling back of the trench insulator structures.

Preferably, for this purpose the hole mask and the trench insulator structures are provided from materials which can be jointly etched selectively with respect to the material of the semiconductor substrate. The hole mask is preferably provided from the material of the trench insulator structures. When the trench insulator structures are pulled back in the sections adjoining the trench sections of the semiconductor fin, the sections of the hole mask that bear on the trench insulator structures and also the trench insulator structures are pulled back simultaneously in an etching step with a high isotropic portion, preferably a wet etching step.

In order to provide the hole mask, in a first manner, prior to the introduction of the trench insulator structures and of the cell insulator structures, a protective layer is applied to the semiconductor substrate. In this case, the protective layer is provided from a different material than the trench insulator structures. An auxiliary layer is applied to a process surface that is then formed in sections by the protective layer, the trench insulator structures and the cell insulator structures. The auxiliary layer is patterned by means of a photolithographic method, an auxiliary mask with striplike trenches that run orthogonally with respect to the cell rows being formed from the auxiliary layer. Through the trenches of the auxiliary mask, the protective layer is uncovered in each case in the vertical projection of the inner trench sections of the semiconductor fins. In the vertical projection of the mask sections of the semiconductor fins, the protective layer is covered by the auxiliary mask. The protective layer is pulled back selectively with respect to the material of the trench insulator structures, so that, after the removal of the auxiliary mask, the hole mask is formed in sections from residual sections of the protective layer, the trench insulator structures and also the cell insulator structures. This way of forming the hole mask is suitable for memory cell layouts with one and with two selection transistors per semiconductor fin.

For memory cell layouts with precisely one selection transistor per semiconductor fin, according to a second manner, in order to provide the hole mask, the trench insulator structures are provided from a different material than the cell insulator structures. Prior to the introduction of the trench insulator structures and of the cell insulator structures, a protective layer is applied to the semiconductor substrate. In this case, the protective layer is provided from a different material than the trench insulator structures and the cell insulator structures.

The cell insulator structures are pulled back selectively both with respect to the material of the protective layer and with respect to the material of the trench insulator structures, vertical sidewalls of the protective layer being uncovered toward the pulled-back cell insulator structures. The protective layer is pulled back in an etching step with an isotropic portion. The layer thickness of the protective layer is reduced in this case. In addition, the protective layer is pulled back proceeding from the uncovered sections facing the cell insulator structures. The pulling back of the protective layer is terminated as soon as the outer mask sections of the semiconductor fins are uncovered. The central, inner trench sections of the semiconductor fins remain covered in each case by a section of the pulled-back protective layer. A hole mask material is applied and removed and planarized at least as far as the upper edge of the sections of the pulled-back protective layer. The sections of the pulled-back protective layer are removed selectively with respect to the hole mask material. In this embodiment of the method according to the invention, the hole mask is formed completely from the hole mask material.

In the case of this way of forming the hole mask, the openings in the hole mask and thus the buried sections of the gate electrode of a FinFET formed in this way are advantageously formed in a self-aligned manner with respect to the cell insulator structures. For CFETs, the gate trench is in each case additionally aligned with respect to the cell insulator structures.

This last is advantageous particularly when the cell insulator structures are provided as filling structures of upper sections of hole trenches, in the lower sections of which trench capacitors are formed. A misalignment between the gate trenches and the trench capacitors, as is typical when using two masks for photolithographic methods and which could lead at least to different resistances of a buried connection (buried strap) between the inner electrode of the trench capacitor and a first source/drain region of the respectively assigned fin field effect transistor, is avoided.

The method according to the invention is furthermore advantageous particularly when the semiconductor fins of mutually adjacent cell rows are formed in a manner offset by in each case half a cell length with respect to one another. In a checkerboard layout, word lines which are provided perpendicular to the cell rows and form the gate electrodes in each case in sections are then led alternately over gate trenches and trench capacitors. Whereas in conventional methods the trench insulator structures are completely pulled back between a respective semiconductor fin and a trench capacitor adjacent orthogonally with respect to the orientation of the semiconductor fin and buried sections of the word line or the buried gate electrode sections thus directly adjoin the trench capacitors, according to the invention the trench insulator structures are pulled back only in sections adjoining the semiconductor fin. The sections adjoining the trench capacitor are preserved, by contrast. Compared with conventional methods for fabricating fin field effect transistors, the method according to the invention therefore enables a good capacitive decoupling and resistive insulation of the word line from the trench capacitors traversed or spanned by the word line.

The method according to the invention leads to a novel curved channel field effect transistor (CFET) for DRAM memory cell arrangements. The curved channel field effect transistor comprises an active zone and a gate electrode. The active zone is formed in a semiconductor fin with two parallel longitudinal sides, into which a gate trench structure is introduced in an inner trench section from a fin surface, which gate trench structure extends from one longitudinal side to the other longitudinal side.

The active zone comprises two source/drain regions that are arranged on both sides of the gate trench structure, adjoin the fin surface and are in each case formed as doped zones, and also a body region in the section between the two source/drain regions of the semiconductor fin. The lower edge of the body region is provided below the lower edge of the gate trench structure, so that the body region extends from one source/drain region to the other source/drain region.

The gate electrode has two plate sections extending in each case along one of the longitudinal sides of the semiconductor fin. The plate sections extend to below the lower edge of the gate trench structure, so that the formation of a conductive channel between the two source/drain regions can be controlled by a potential at the gate electrode.

According to the invention, the plate sections extend in each case proceeding from an intersection edge of the gate trench structure with the respective longitudinal side of the semiconductor fin uniformly as far as a maximum depth of half the fin width along the active zone. The gate trench structure is formed as a trench section of the respective gate electrode which connects the two plate sections to one another. The plate sections of the gate electrode form a fin gate. The plate sections cover the area of intersection of the gate trench structure with the respective longitudinal side of the semiconductor fin and overlap with a uniform width sections of the body region that adjoin the area of intersection.

The transistor structure according to the invention can advantageously be fabricated in a simple manner by means of the method according to the invention described above.

A DRAM transistor array according to the invention having curved channel field effect transistors for DRAM memory cell arrangements has a plurality of such field effect transistors that are in each case arranged in cell rows.

In this case, the semiconductor fins of mutually adjacent cell rows are provided in a manner offset by in each case half a cell length with respect to one another. Trench insulator structures are provided between the cell rows.

In each case either precisely one field effect transistor or a pair of field effect transistors is or are formed in the semiconductor fins, the two field effect transistors being arranged in mirror-inverted fashion with respect to one another and a first source/drain region of one field effect transistor and a second source/drain region of the other field effect transistor being provided as a single contiguous doped zone.

The gate electrodes of a plurality of field effect transistors are in each case sections of word lines running perpendicular to cell rows. In this case, the word lines are led alternately over the gate trench structures of FinFETs or CFETs and cell insulator structures or trench capacitors. The word lines are advantageously insulated and decoupled from the inner electrodes of the respectively traversed trench capacitors by comparatively thick sections of the trench insulator structures that have not been pulled back adjacent to the trench capacitors.

FIG. 1 illustrates a stack of masks for forming a DRAM memory cell arrangement in a semiconductor substrate, which gives rise to a plan view of a DRAM memory cell arrangement. In this case, the illustration shows the openings from hole masks and, from strip masks, fin or trench structures resulting from the strip masks. In the region of a memory cell 100, reference is made to the structures formed on the basis of the masks in photolithographic methods.

Trench capacitors 3' formed in the semiconductor substrate correspond to openings 93 in a trench mask. The trench capacitors 3' are arranged within cell rows 110 in each case at the spacing of a cell length. Respectively adjacent cell rows 110 are provided in a manner offset by half the cell length with respect to one another.

Corresponding to fin sections 91 of a cell row mask, semiconductor fins 11 are formed between in each case two trench capacitors 3' that are adjacent in the same cell row 110. Trench insulator structures 2 are formed between the cell rows 110. Corresponding to trench sections 92 of a gate trench mask, central sections of the semiconductor fins 11 are pulled back and gate trenches 13 are formed in the semiconductor fins 11 in the process. Corresponding to fin sections 98 of a word line mask, word lines 8 are formed above the gate trenches 13. The word lines 8 run perpendicular to the cell rows 110 and alternately span semiconductor fins 11 and trench capacitors 3'. Corresponding to openings 90 in a bit contact mask, bit contacts 84 are provided on the semiconductor fins 11.

This illustration shows, from a memory cell 100, a trench capacitor 3', a semiconductor fin 11 adjoining the trench capacitor 3' toward the left, and the assigned bit contact 84. The semiconductor fin 11 is recessed by the gate trench 13 between the trench capacitor 3' and the bit contact 84. The semiconductor fin 11 forms an active zone of a selection transistor of the memory cell 100, said selection transistor being formed as a CFET. A gate electrode of the CFET is formed by a section of the word line or gate conductor structure 8 crossing the semiconductor fin 11 above the gate trench 13.

A first source/drain region 121 of the CFET is formed between the gate trench 13 and the trench capacitor 3' in the semiconductor fin 11 and is connected to an inner electrode of the trench capacitor 3'. A second source/drain region 122 of the CFET 4 is formed below the bit contact 84 in the semiconductor fin 11. In a manner dependent on a potential of the word line 8, in the active zone of the CFET 4, a conductive channel is formed between the first 121 and the second 122 source/drain region and through under the gate trench 13.

FIG. 2A to FIG. 2F illustrate cross sections along the line A-B-C-D from FIG. 1 in different phases of an exemplary embodiment of the method according to the invention for fabricating a DRAM memory cell arrangement with trench capacitors and CFETs. The cross sections are in each case accompanied by plan views of the respective structures with identification of the section lines.

A semiconductor substrate 1 is provided and a protective layer 6 is applied on a substrate surface 10 of the semiconductor substrate 1. The protective layer 6 is provided from silicon nitride. Further layers, for instance a stress compensating layer, may be situated under the protective layer 6 (pad nitride). Trench capacitors 3' are provided in the semiconductor substrate 1. In this case, the trench capacitors 3' are formed in each case in a manner oriented to a hole trench that is introduced into the semiconductor substrate 1 through the protective layer 6. An outer electrode (not illustrated) of the trench capacitors 3' is formed as a doped zone in a section of the semiconductor substrate 1 that surrounds a lower section of the hole trench. The outer electrode is insulated from a filling of the hole trench in each case by a capacitor dielectric 35 formed on the wall of the hole trench. The filling is provided from a conductive material and defines an inner electrode 31 of the trench capacitor 3'. In a central section of the hole trench, the inner electrode 31 is insulated from the surrounding semiconductor substrate 1 by a collar insulator 32 formed along the wall of the hole trench. The collar insulator 32 is pulled back on one side, so that the inner electrode 31 adjoins the semiconductor substrate 1 in the region of a buried strap window 33. A cell insulator structure 3 is formed as an oxidic filling of an upper section of the hole trench approximately above the substrate surface 10.

Striplike trenches are etched between the trench capacitors 3' and filled with a dielectric material. Trench insulator structures 2, 21 emerge from the filling of the trenches.

In accordance with the cross section B-C along a cell row as illustrated in FIG. 2A, a semiconductor fin 11 formed from the semiconductor substrate 1, within the cell row, is delimited by two mutually adjacent trench capacitors 3'. In the region of the buried strap window 33, an inner electrode 31 of one trench capacitor 3' adjoins one of the two semiconductor fins 11 that are adjacent in the cell row. The inner electrode 31 is insulated from the other semiconductor fin 11 that is adjacent in the same cell row by means of the collar insulator 32. In accordance with the accompanying plan view, in this exemplary embodiment, respectively adjacent cell rows are provided in a manner offset in each case by half a cell length with respect to one another. The cross section C-D through the midpoint of a trench capacitor 3' perpendicular to the cell row reveals that the trench capacitors 3' are in each case insulated by trench insulator structures 2 from the adjoining semiconductor fin 11 in the adjacent cell row.

The cross section A-B illustrates a cross section perpendicular to the cell row in a section in which the semiconductor fins 11 of adjacent cell rows overlap.

A cross section through the simultaneously processed support circuit region 52 of a DRAM is illustrated in addition to the cross section through a cell array 51. Shallow trench structures 21 are formed in the support circuit region 52, the semiconductor substrate 1 being covered by the protective layer 6 outside said structures.

The accompanying plan view shows the protective layer 6, which is subdivided into individual fields by cell insulator structures 3 within the cell rows and by trench insulator structures 2 between the cell rows. The fields of the protective layer 6 in each case bear on the substrate surface 10 in the region of the semiconductor fins 11.

An auxiliary layer is applied to the process area formed in sections from the fields of the protective layer 6, the trench insulator structures 2, 2' and the cell insulator structures 3 and is patterned photolithographically. In this case, striplike trenches 71' orthogonal to the cell rows are formed in the auxiliary layer, which trenches cross the semiconductor fins 11 in each case in a central section. With the auxiliary mask 71 developed from the auxiliary layer in this way as an etching mask, the material of the protective layer 6 is etched back selectively with respect to the material of the trench insulator structures 2 and the cell insulator structures 3 as far as the substrate surface 10.

Figure 2B:
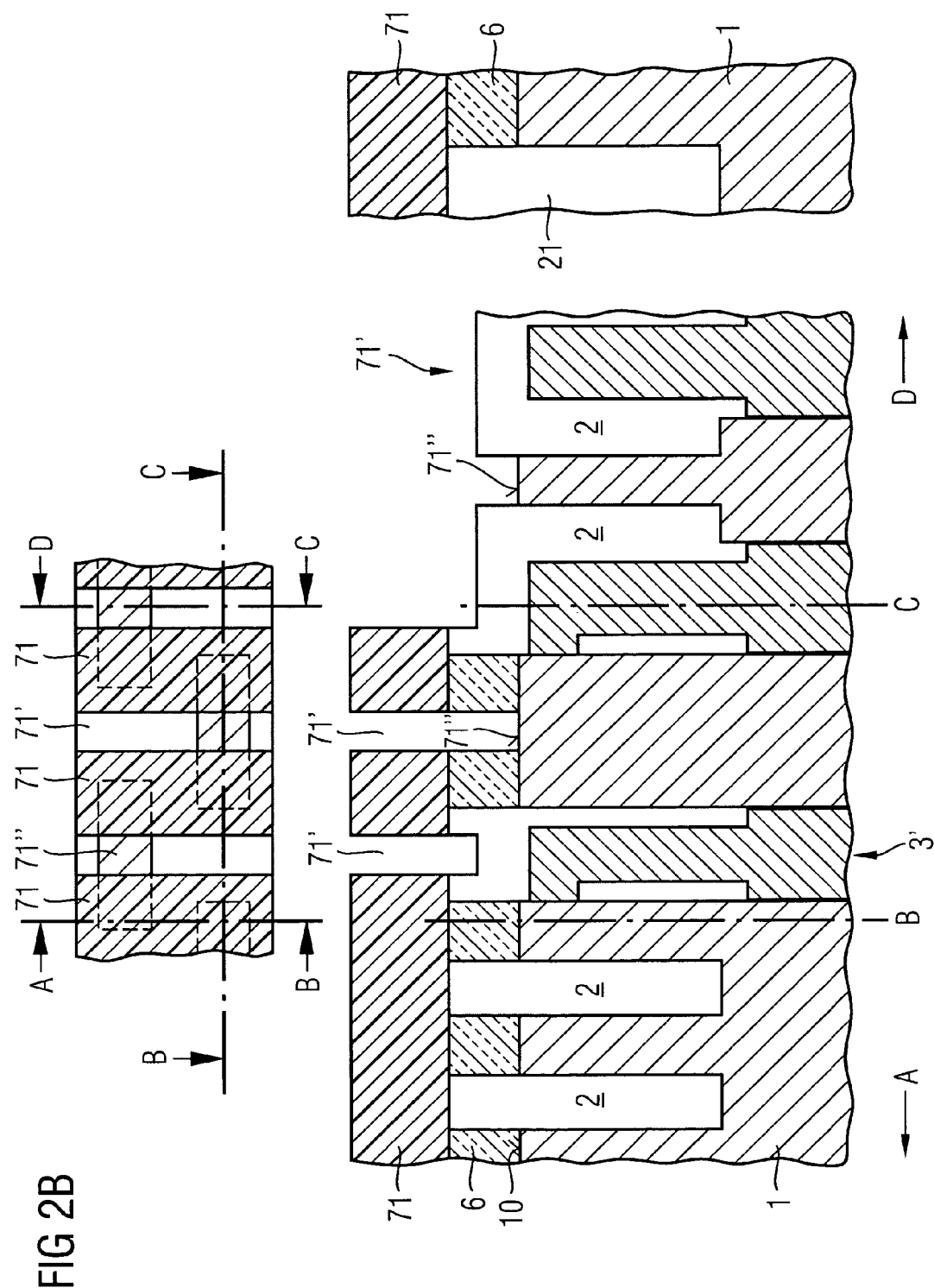
FIG. 2 illustrates a first exemplary embodiment of a method according to the invention with photolithographic formation of the hole mask and CFETs as fin field effect transistors on the basis of cross sections.

After this etching step, a central section of the semiconductor fins 11 is in each case uncovered in accordance with FIG. 2B. The auxiliary mask 71 has trench openings 71', which are illustrated in cross section in the section B-C and in longitudinal section in the section C-D. Beneath the trench openings 71', within the fields of the protective layer 6 the central section of the semiconductor fins 11 is in each case uncovered through window openings 71". Outside the fields of the protective layer 6, a pulling back of the trench insulator structures 2 or of the cell insulator structures 3 is indicated, the trench and cell insulator structures 2, 3 having been pulled back to a lesser extent than the protective layer 6. During the etching of the window openings 71", the support circuit region 52 is completely covered by the auxiliary mask 71. The trench insulator structures 2 and also the cell insulator structures 3 are provided from silicon oxide in this exemplary embodiment. Where reference is made to the silicon oxide in subsequent method steps, both structures are encompassed thereby.

After the removal of the auxiliary mask 71, the semiconductor substrate 1 is etched selectively with respect to the silicon nitride of the protective layer 6 and the silicon oxide of the trench and cell insulator structures 2, 3.

Figure 2C:
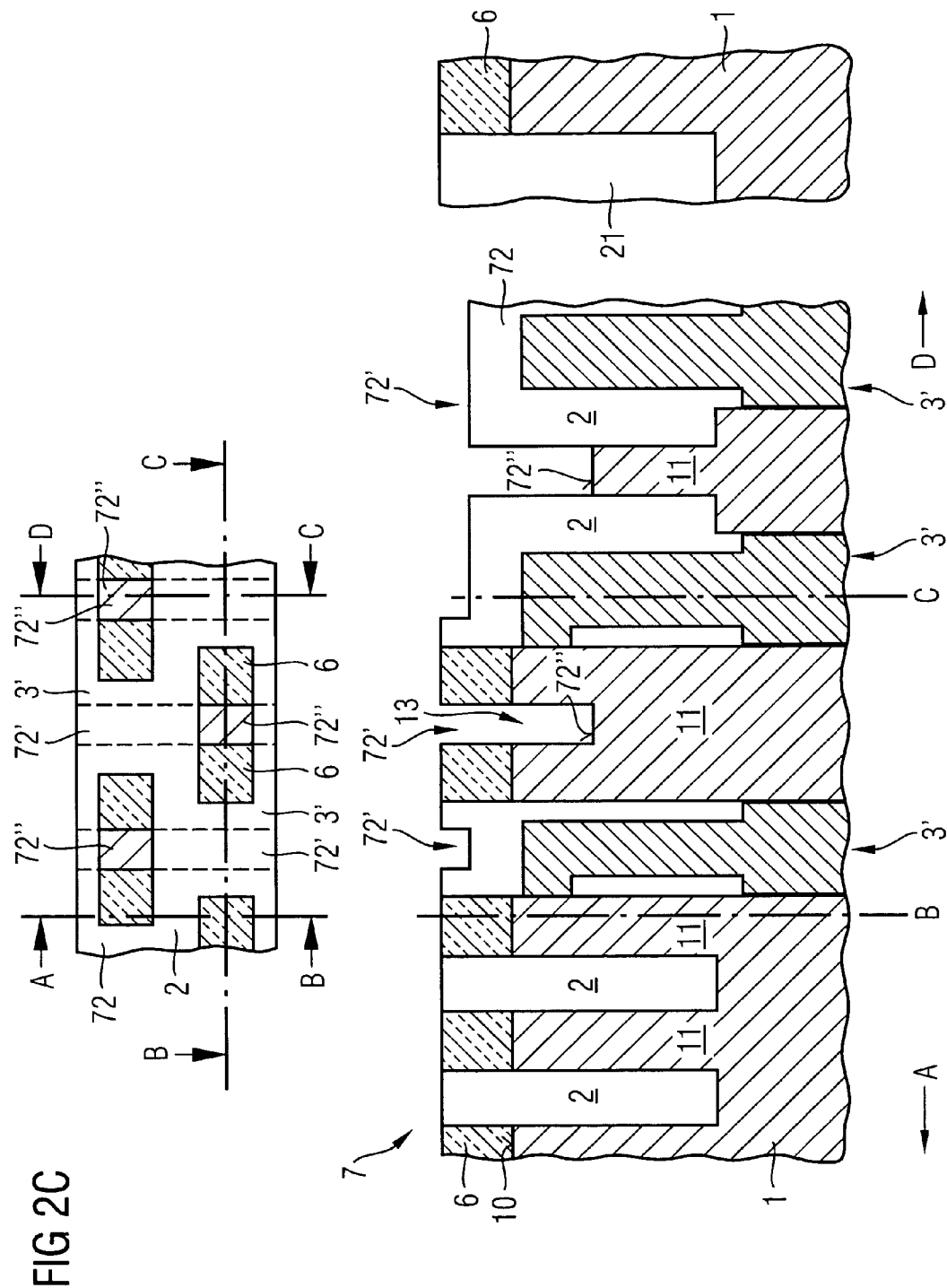

In accordance with the cross section B-C in FIG. 2C, a gate trench 13 is in each case introduced in a central section of the semiconductor fins 11. The gate trench 13 is delimited, within the cell row, by the sections of the semiconductor fin 11 that have not been etched back and, perpendicular to the cell row, corresponding to the cross section C-D, by the silicon oxide of the trench insulator structures 2. The fields of the protective layer 6 and also the silicon oxide of the trench and cell insulator structures 2, 3 form a hole mask 7.

The accompanying plan view reveals the fields of the protective layer 6 that are embedded between the silicon dioxide of the trench and cell insulator structures 2, 3, the central sections of the semiconductor fins 11 being uncovered through window openings 72" in the hole mask 7. The lengthenings of the gate trenches 13 in the silicon oxide 2, 3 are fashioned as groovelike depressions produced as a side effect during the etching of the protective layer 6.

The silicon oxide of the trench and cell insulator structures 2, 3 is pulled back isotropically in a wet etching process.

The result, in a simplified illustration, is the structure illustrated in FIG. 2D. The trench insulator structures 2 and the cell insulator structures 3 are pulled back in the vertical direction by means of the isotropic etching. The silicon oxide is additionally pulled back from uncovered vertical sections of the silicon oxide in the horizontal direction. Vertical sections of the trench insulator structure 2 are uncovered on both sides of the gate trench 13. In accordance with the cross section C-D, the trench insulator structure 2 is additionally thinned in the horizontal direction in the region of the gate trench 13. Pockets 22 result on both sides of the gate trench 13, which pockets continue into the depth of the trench insulator structures 2 at the bottom of the gate trench 13.

The pockets 22 are formed in a cross section parallel to the cross-section line B-C and illustrated in dashed fashion.

The accompanying plan view illustrates the pockets 22 on both sides of the window openings 73" as depressions which in each case extend along the longitudinal sides of the semiconductor fin 11 beyond the window opening 73". In the exemplary embodiment illustrated, the etching depth for pulling back the silicon oxide of the trench and cell insulator structures 2, 3 amounts to approximately half the fin width.

The protective layer 6 is completely removed.

The result is the structure illustrated in FIG. 2E, in which the surface of the semiconductor fins 11 is uncovered.

Implantations for forming source/drain regions 121, 122 of the selection transistors 4 are subsequently performed. A gate dielectric 80 is formed on the uncovered sections of the semiconductor fins 11 for instance by oxidation of the semiconductor substrate 1 or by deposition of a dielectric material. Sublayers 81, 82, 83 of a gate conductor layer stack are deposited one after the other, the pockets 22 being filled with a conductive material. The gate conductor layer stack is patterned by means of a photolithographic method to form gate conductor structures or word lines 8 running perpendicular to the cell rows above the gate trenches 13.

Figure 2F:
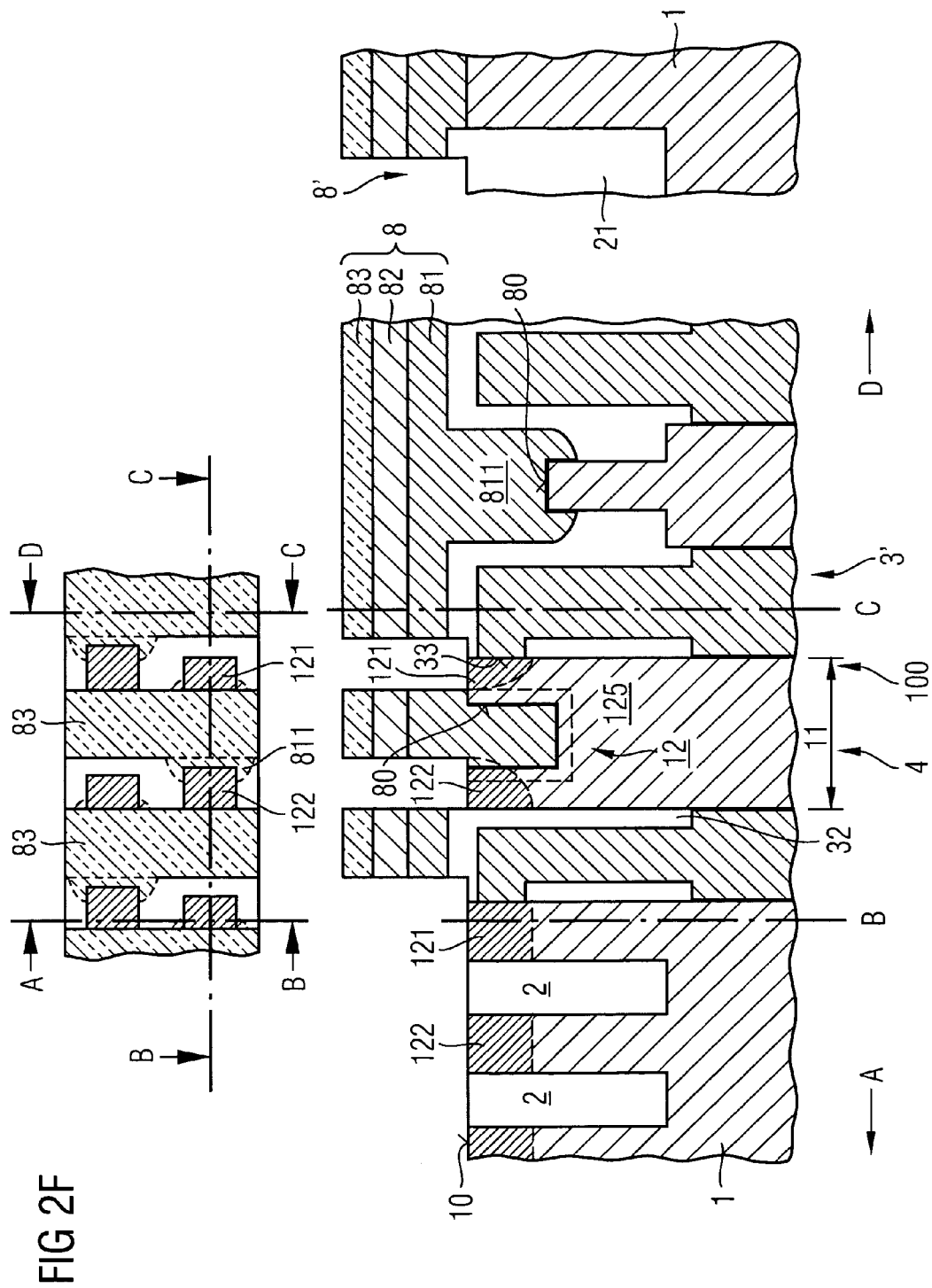

FIG. 2F illustrates, in the section C-D, a word line 8 in longitudinal section and, in the section B-C, in each case a passive word line 8 led over a trench capacitor 3' and an active word line 8 led over the semiconductor fin 11 of the memory cell in cross section. The word line 8 comprises a base layer 81 made of a conductive material, for instance doped polysilicon. Buried sections 811 of the base layer 81 fill the pockets 22 and the gate trenches 13. A highly conductive layer 82 is applied on the base layer 81 and an insulator layer 83 is applied on the highly conductive layer 82. The base layer 81 of the word line 8 is insulated from the semiconductor fin 11 by the gate dielectric 80.

A memory cell 100 is illustrated in longitudinal section in the cross section B-C. The memory cell 100 comprises a trench capacitor 3' and a CFET as selection transistor 4. The selection transistor 4 comprises an active zone 12 formed in a semiconductor fin 11. The active zone 12 comprises a first source/drain region 121, which, in the region of the buried strap window 33, adjoins the inner electrode 31 of the trench capacitor 3' of the memory cell 100. The active zone 12 furthermore comprises a second source/drain region 122, which is insulated by a collar insulator 32 from the trench capacitor 3' of the adjacent memory cell that adjoins the memory cell 100 in the same cell row.

There is introduced between the two source/drain regions 121, 122 a buried section 811 of a base layer 81 of the gate conductor structure 8, which, in a cross section parallel to the cross section B-C, overlaps the body region 125 on both longitudinal sides with uniform width. When a suitable potential is applied to the gate conductor structure 8, a conductive channel is formed in a channel section—covered by the gate conductor structure 8—of a body region 125 formed between the two source/drain regions 121, 122. The channel section extends along the wall of the gate trench 113 and, in sections, on both longitudinal sides of the semiconductor fin 11.

The processing of gate conductor structures 8' in the support circuit region 52 is effected analogously to the gate conductor structure 8 in the cell array 51. Bit contacts 84 for making contact with the second source/drain regions 122 are formed. A plurality of bit contacts 84 are in each case connected to one another by means of bit lines that are formed perpendicular to the word lines 8. A customary BEOL process for completing a DRAM memory cell arrangement ensues.

In the exemplary embodiment of FIG. 3, the cell insulator structures are produced by the filling of the hole trenches with doped polysilicon as far as the upper edge of the protective layer 6.

Figure 3A:
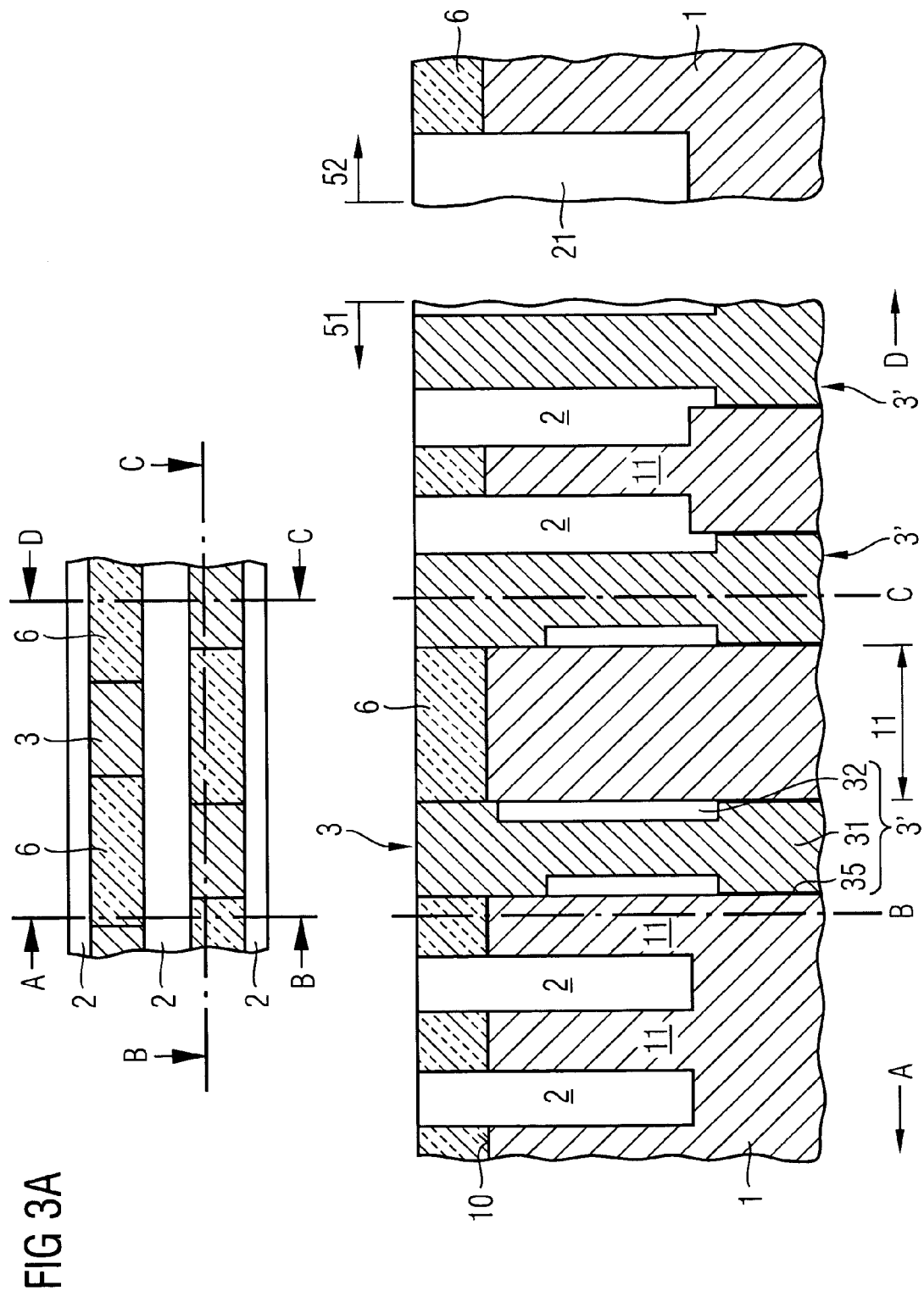
FIG. 3 illustrates a second exemplary embodiment of a method according to the invention with non-photolithographic formation of the hole mask and FinFETs as fin field effect transistors on the basis of cross sections.

The structure illustrated in cross section in FIG. 3A differs from the structure illustrated in FIG. 2 by virtue of the different choice of material for the cell insulator structures 3 and the trench insulator structures 2. The material of the cell insulator structures 3 is polysilicon and the material of the trench insulator structures is silicon oxide.

The accompanying plan view illustrates two parallel cell rows that are offset by half a cell length with respect to one another and are insulated from one another by a trench insulator structure 2. Within the cell rows, in each case two adjacent semiconductor fins 11 covered by fields of the protective layer 6 are insulated from one another by cell insulator structures 3 made of polysilicon that are formed as upper sections of trench capacitors 3'.

The polysilicon is etched back in the hole trenches to below the lower edge of the protective layer 6. The end sides of the fields of the protective layer 6 that are oriented to the cell insulator structures 3 are uncovered. In a subsequent etching process with an isotropic portion, the fields of the protective layer 6 are thinned and pulled back from the uncovered end sides of the semiconductor fins 11.

Figure 3B:
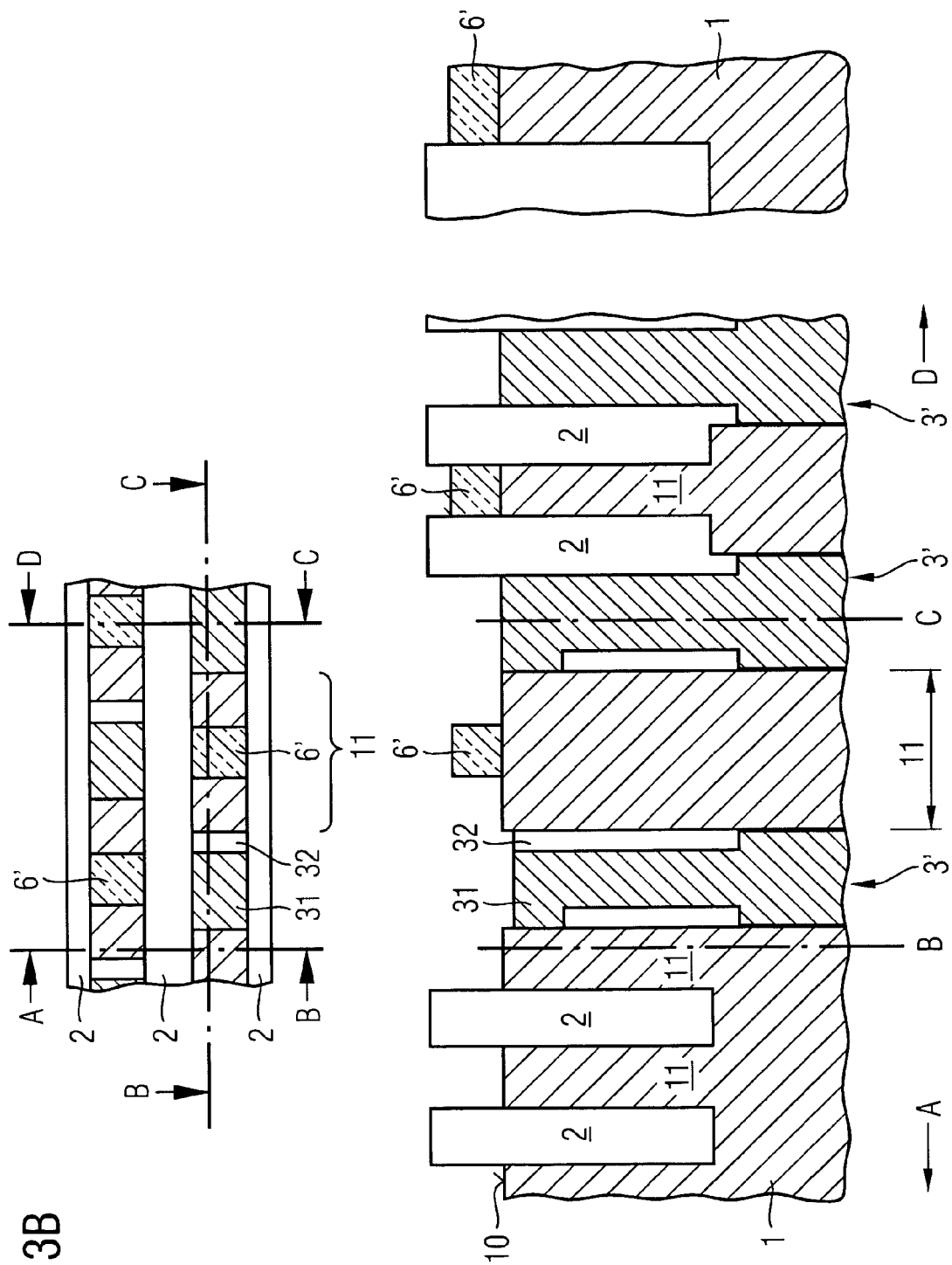

FIG. 3B reveals that the pulled-back sections 6' of the protective layer 6 in each case cover central sections of the semiconductor fins 11 from one trench insulator structure 2 to the opposite trench insulator structure 2.

Silicon oxide is deposited and the structure is filled in the process. The deposited silicon oxide is planarized and removed at least as far as the upper edge of the pulled-back sections 6' of the protective layer.

Figure 3C:
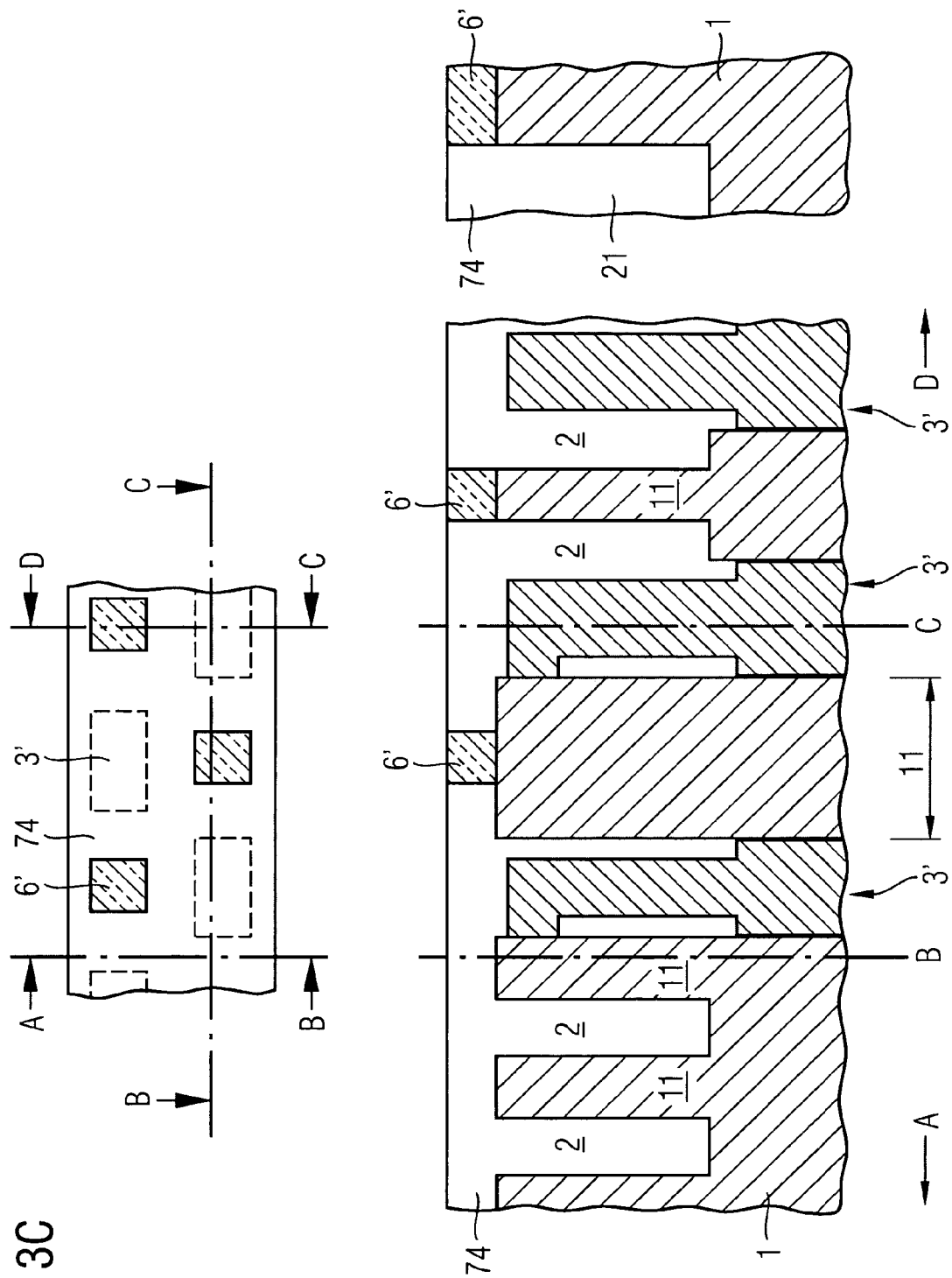

In accordance with FIG. 3C, an intermediate structure 74 formed in sections from sections of the trench insulator structures 2 and the deposited silicon oxide covers the surface of the structure. Only in each case the central sections of the semiconductor fins 11 are covered by the pulled-back sections 6' of the protective layer.

The silicon nitride of the pulled-back sections 6' of the protective layer is removed selectively with respect to the silicon oxide of the intermediate structure 74.

Figure 3D:
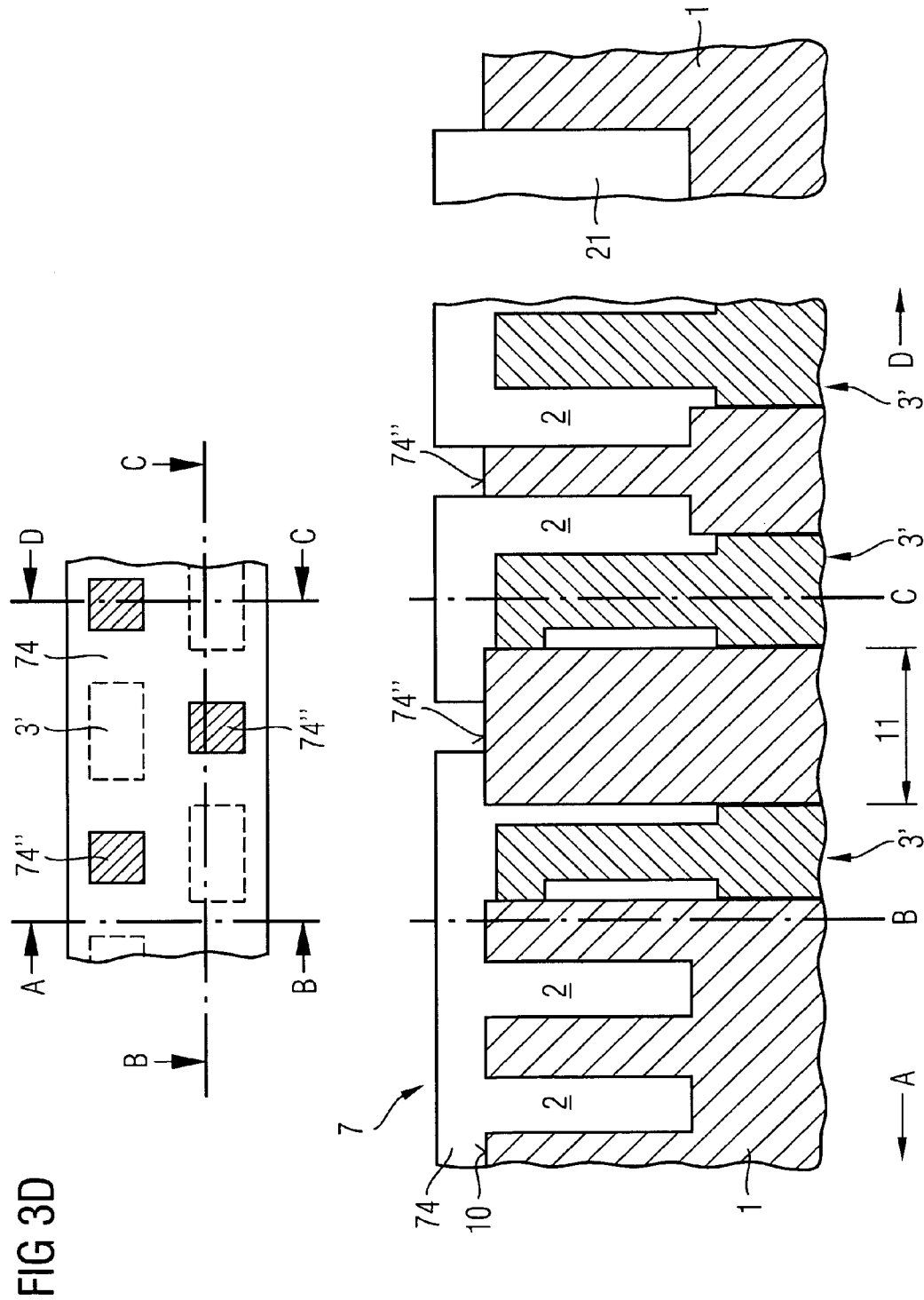

The intermediate structure 74 forms a hole mask 7, illustrated in FIG. 3D. Through openings 74" in the hole mask 7, the central sections of the semiconductor fins 11 are uncovered from one longitudinal side as far as the opposite longitudinal side of the semiconductor fin 11.

In the course of a wet etching, the silicon oxide of the intermediate structure 74 is etched back isotropically. In this case, proceeding from the window openings 74", sections of the trench insulator structures 2 that adjoin the window openings 74" are uncovered and likewise etched back.

Figure 3E:
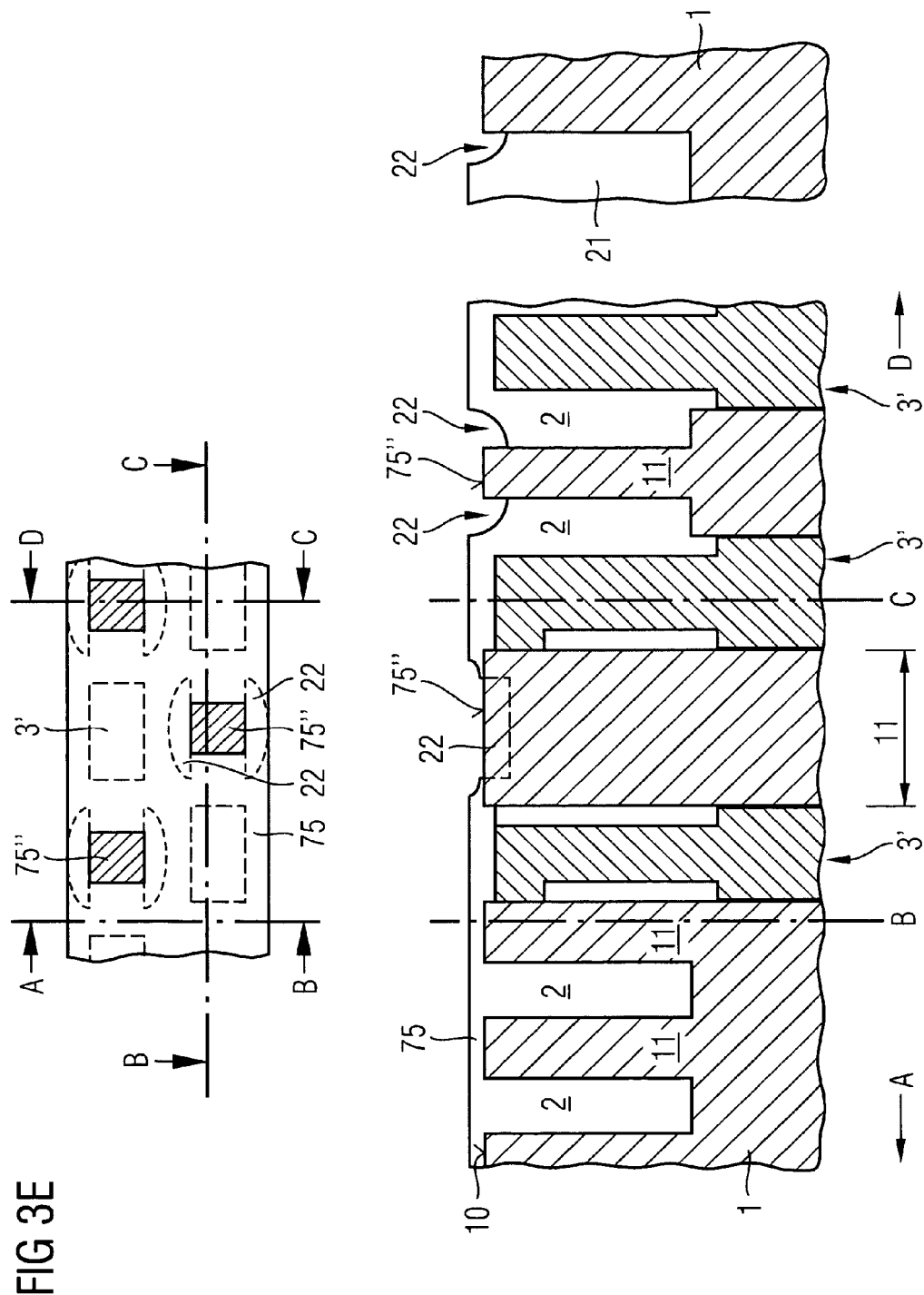

As illustrated in FIG. 3E, a thinned intermediate structure 75 with enlarged window openings 75" has emerged from the intermediate structure 74 from FIG. 3D. Sections of the gate insulator structures 2 that adjoin the window openings 75" have been pulled back and pockets 22 have arisen in their place.

The pockets 22 extend into the trench insulator structures 2 to a depth of approximately half the fin width in the horizontal and vertical direction.

Figure 3F:
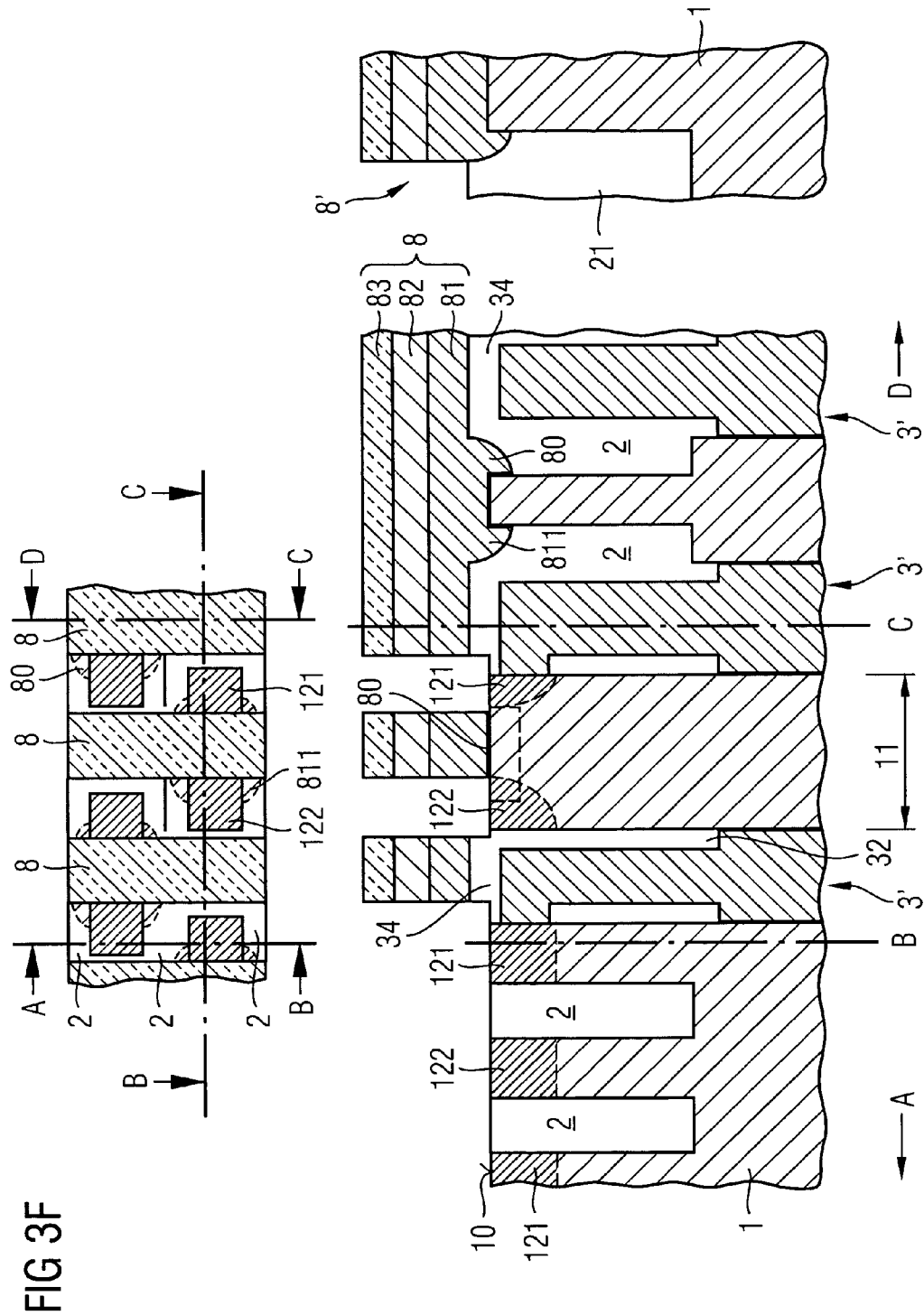

In accordance with FIG. 3F, word lines 8 and source/drain regions 121, 122 are formed. In contrast to FIG. 2F, which illustrates a cell array having CFETs, a cell structure having FinFETs results in accordance with FIG. 3F.

Figure 4:
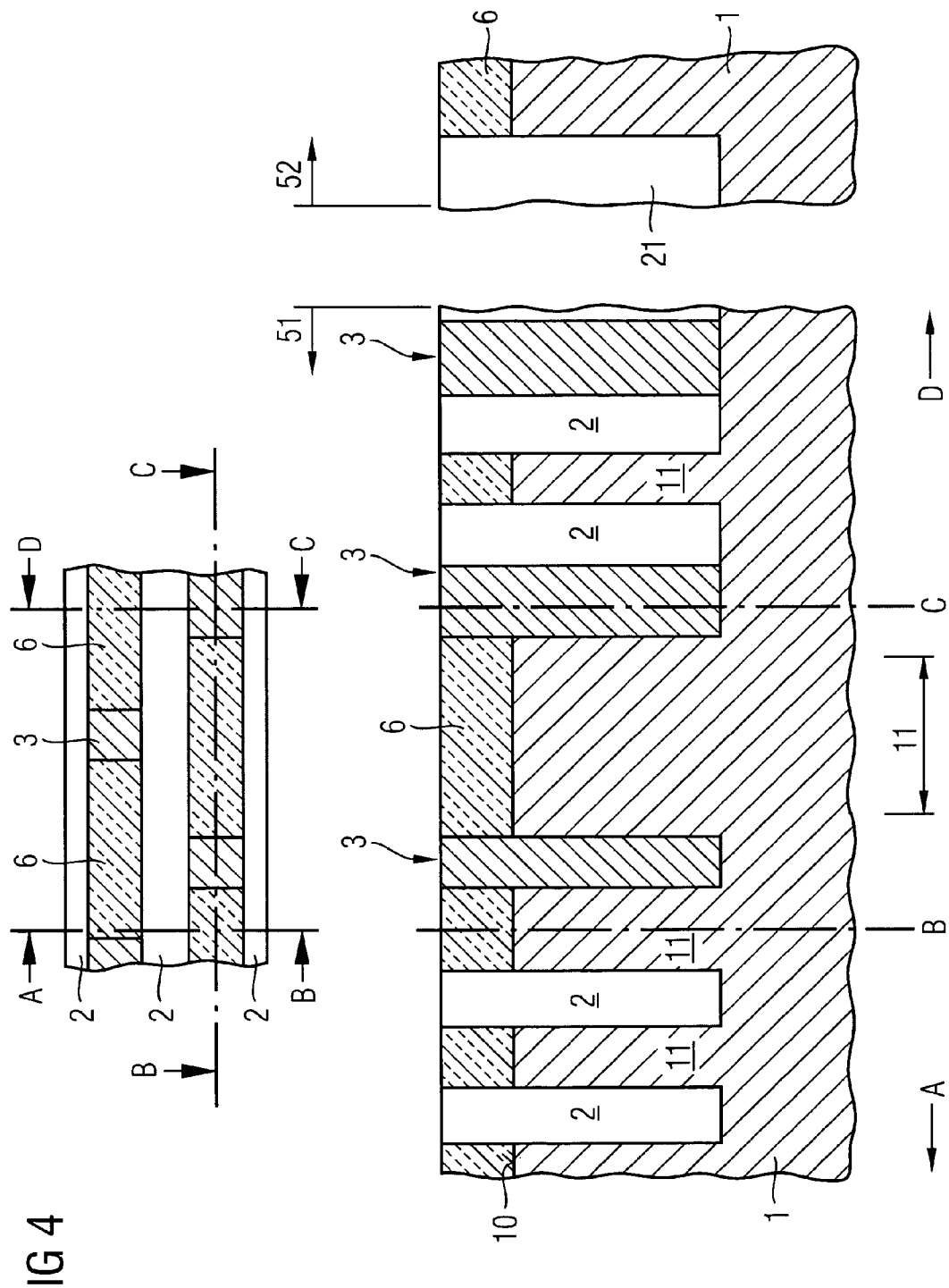
FIG. 4 illustrates a third exemplary embodiment of a method according to the invention for fabricating a DRAM memory cell arrangement with stacked capacitors.
Figure 5A:
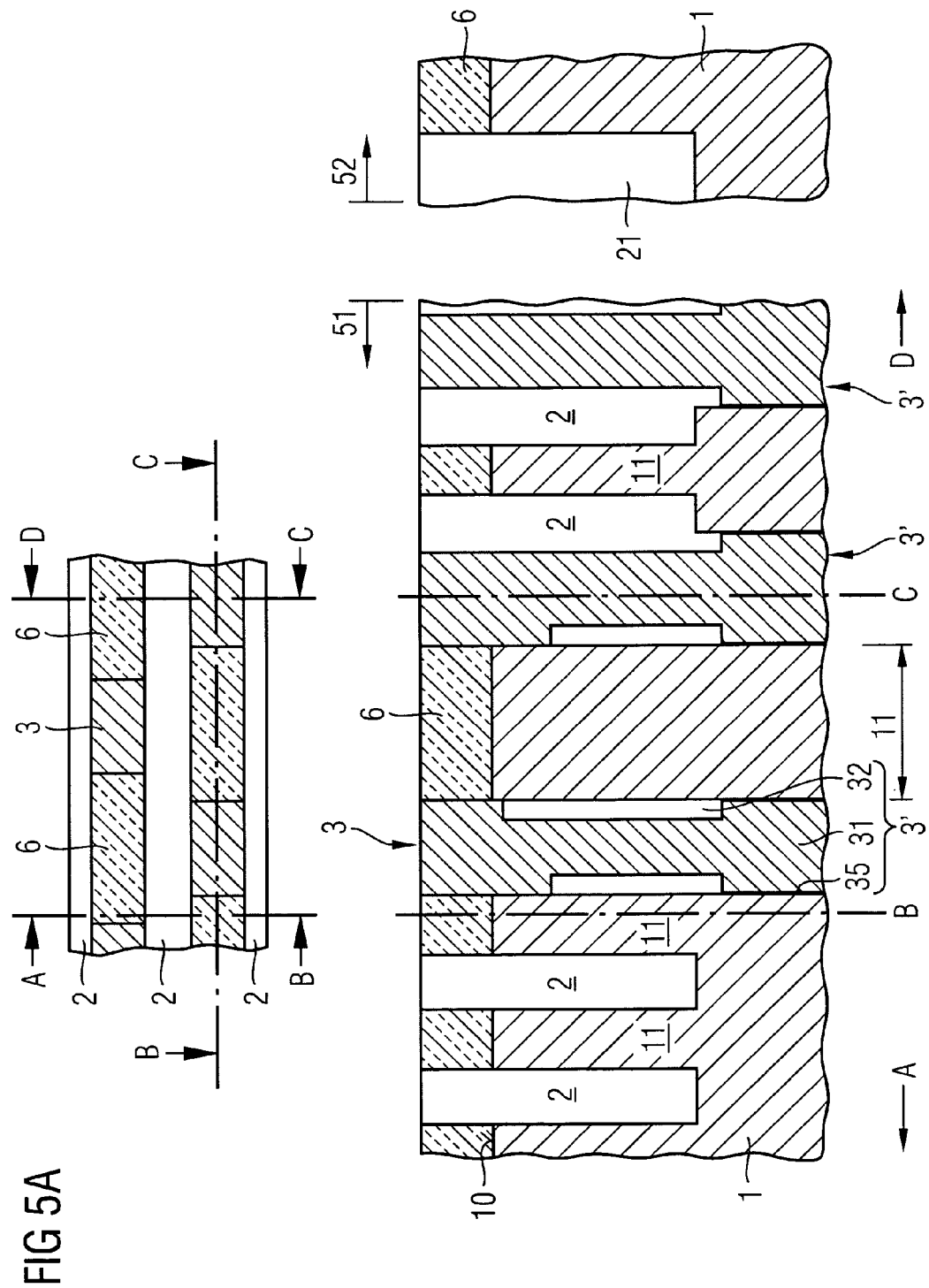
FIG. 5 illustrates a fourth exemplary embodiment of a method according to the invention with non-photolithographic formation of the hole mask and CFETs as fin field effect transistors on the basis of cross sections.
Figure 5B:
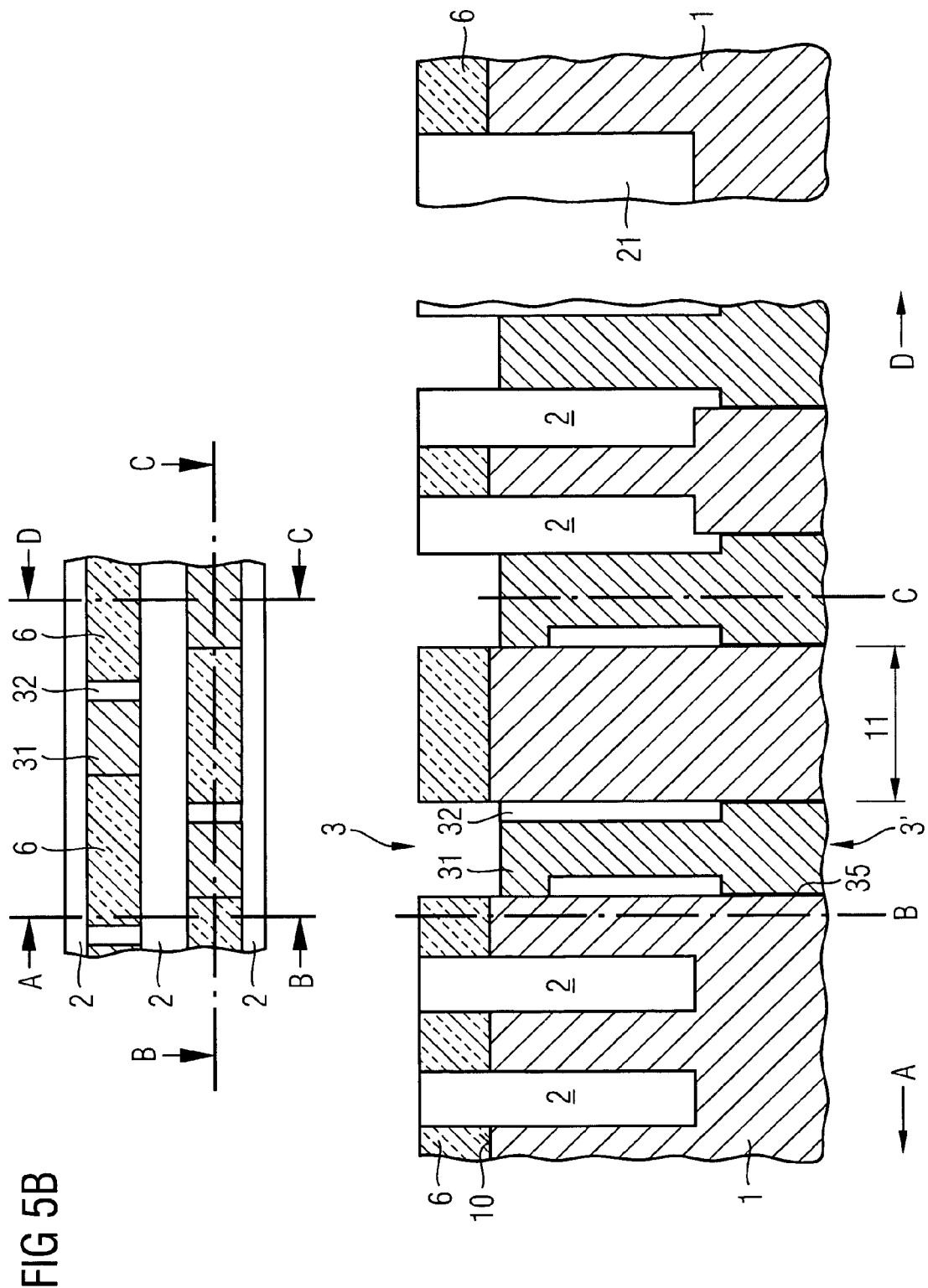
Figure 5C:
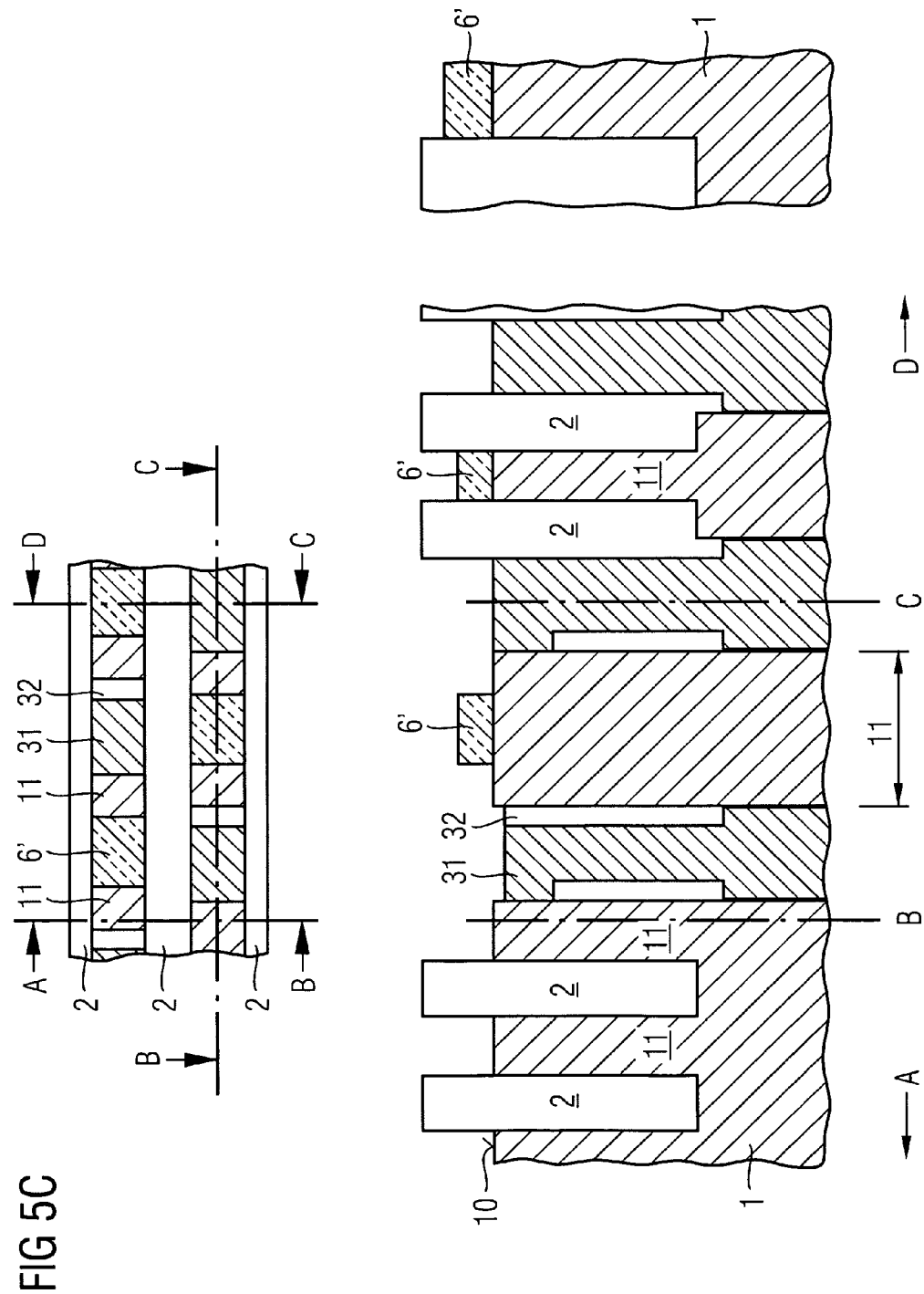
Figure 5D:
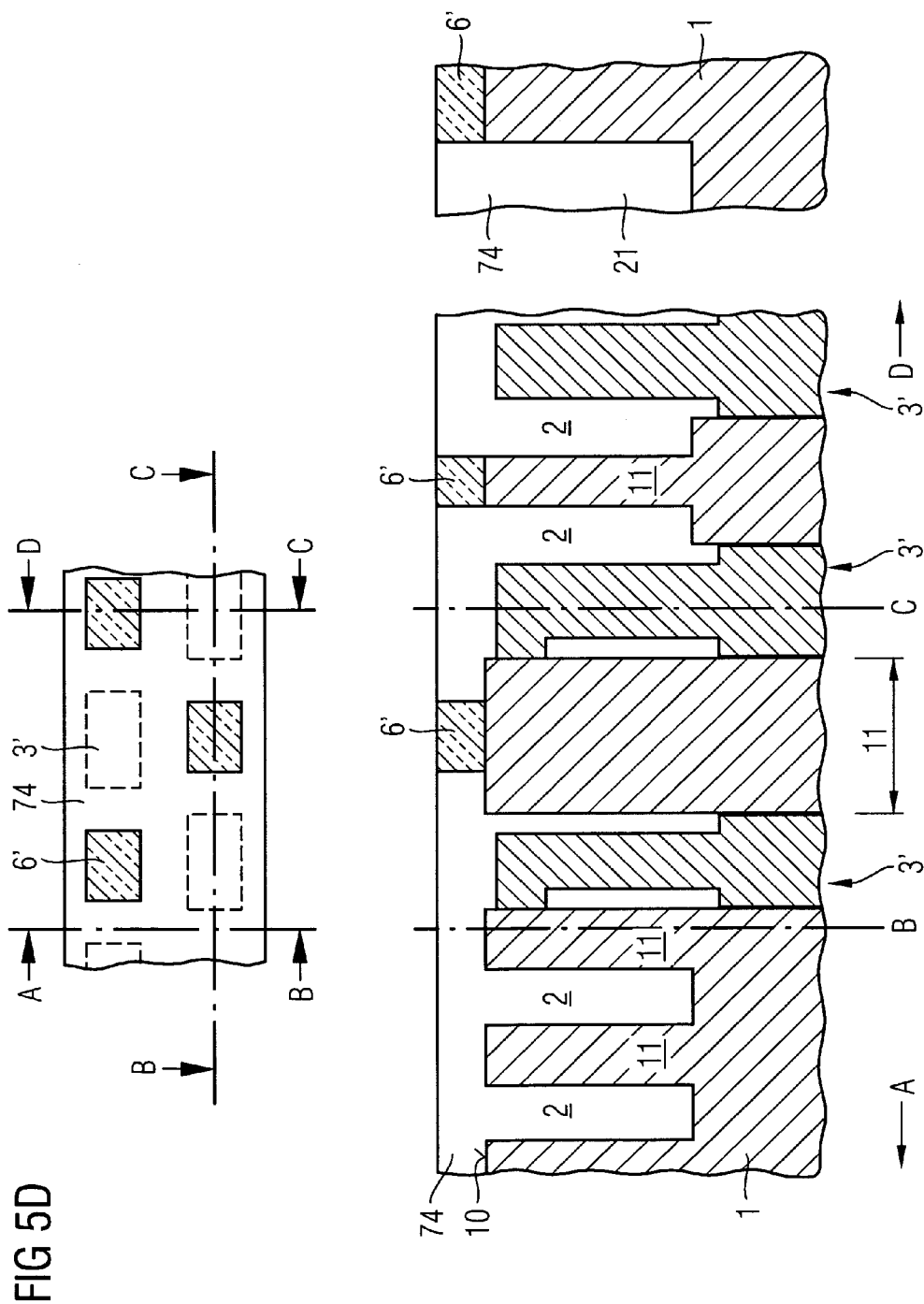
Figure 5G:
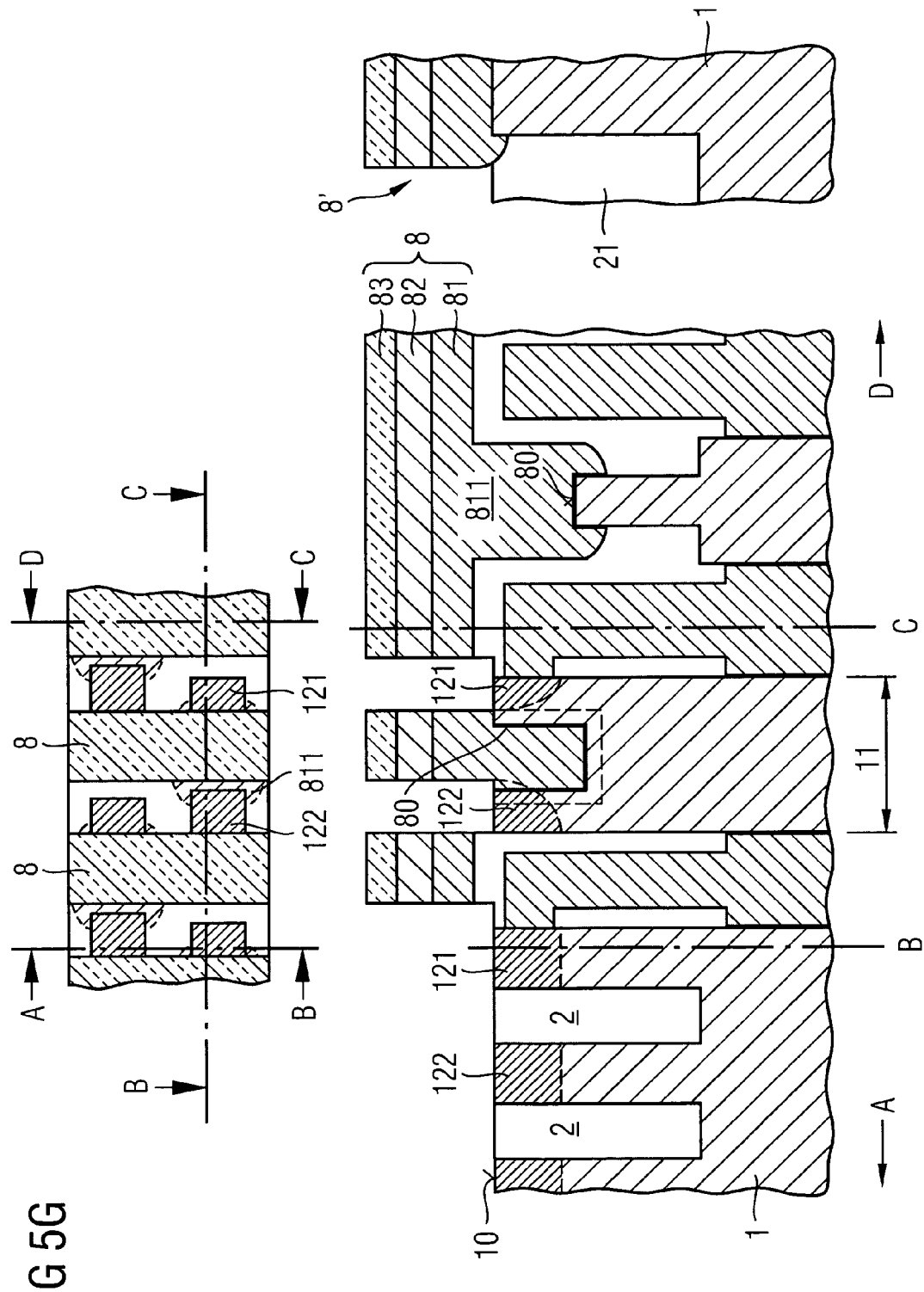

FIG. 4 relates to the fabrication of a transistor array for a DRAM memory cell arrangement with stacked capacitors.

In contrast to FIG. 3A and FIG. 2A with a formation of the cell insulator structures 3 as upper sections of a filling of hole trenches, in the lower section of which trench capacitors 3' are formed, the cell insulator structures 3 are simple insulator structures which can be formed for instance in a method analogously to FIG. 2 partly at the same time as the trench insulators 2.

Proceeding from the structure illustrated in FIG. 4, the processing of a cell array for DRAM memory cell arrangements with stacked capacitors is effected in accordance with FIGS. 3A to 3F for memory cell arrangements having FinFETs as selection transistors or 5A to 5F for memory cell arrangements having CFETs as selection transistors. Afterward, in each case in addition, the respective first source/drain regions 121 of the selection transistors are contact-connected and stacked capacitors are formed, which are in each case connected to the first source/drain regions 121.

The exemplary embodiment illustrated with reference to the drawings of FIG. 5 differs from the exemplary embodiment illustrated with reference to FIG. 3 by the fact that gate trenches 13 are etched into the semiconductor fins 11 prior to the silicon oxide being pulled back isotropically in the course of a wet etching process using the intermediate structure 74 as a hole mask 7. In this case, the support circuit region 52 is covered by a resist mask 76. The formation of the pockets 22 and the further processing are in this case effected largely analogously to FIG. 2E.

In the exemplary embodiment of a CFET illustrated in FIG. 6, a first source/drain region 121 and a second source/drain region 122 are formed in a semiconductor fin 11 in a manner adjoining a substrate surface 10 along a longitudinal axis. The two source/drain regions 121, 122 are spaced apart from one another by a gate trench 13. The gate trench 13 is introduced from the substrate surface 10 such that it reaches to below a lower edge of the source/drain regions 121, 122. Beneath the source/drain regions 121, 122, a body region 125 of the CFET 4 is formed in the semiconductor fin 11. The body region 125 adjoins the two source/drain regions 121, 122 and extends to below the lower edge of the gate trench 13. Proceeding from the areas of intersection of the longitudinal sides of the semiconductor fin 11 with the gate trench 13, plate sections 851 of a gate electrode 85 overlap the body region 125 on both sides of the semiconductor fin 11 to a uniform extent. A trench section 852 of the gate electrode 85 is provided as filling of the gate trench 13. The two plate sections 851 of the gate electrode 85 are connected to one another by the trench section 852. The gate electrode 85 is spaced apart from the semiconductor fin 11 by a gate dielectric 80. Insulator structures 2 adjoin the longitudinal sides of the CFET 4.

During operation of the CFET 4, a conductive channel 14 is formed between the two source/drain regions 121, 122 by means of a suitable potential at the gate electrode 85 in a section of the body region 125 that adjoins the gate dielectric 80. A cell current 15 flows through the channel 14. The length of the channel 14 is essentially determined by the depth of the gate trench 13. The source/drain regions 121, 122 and also the body region 125 form the active zone 12 of the CFET 4.

With this design of the plate section 851, there is no need for a critical step of etching back the gate electrode material below the substrate surface. The plate sections can be formed in a self-aligned manner with respect to the gate trenches 13.

Figure 7:
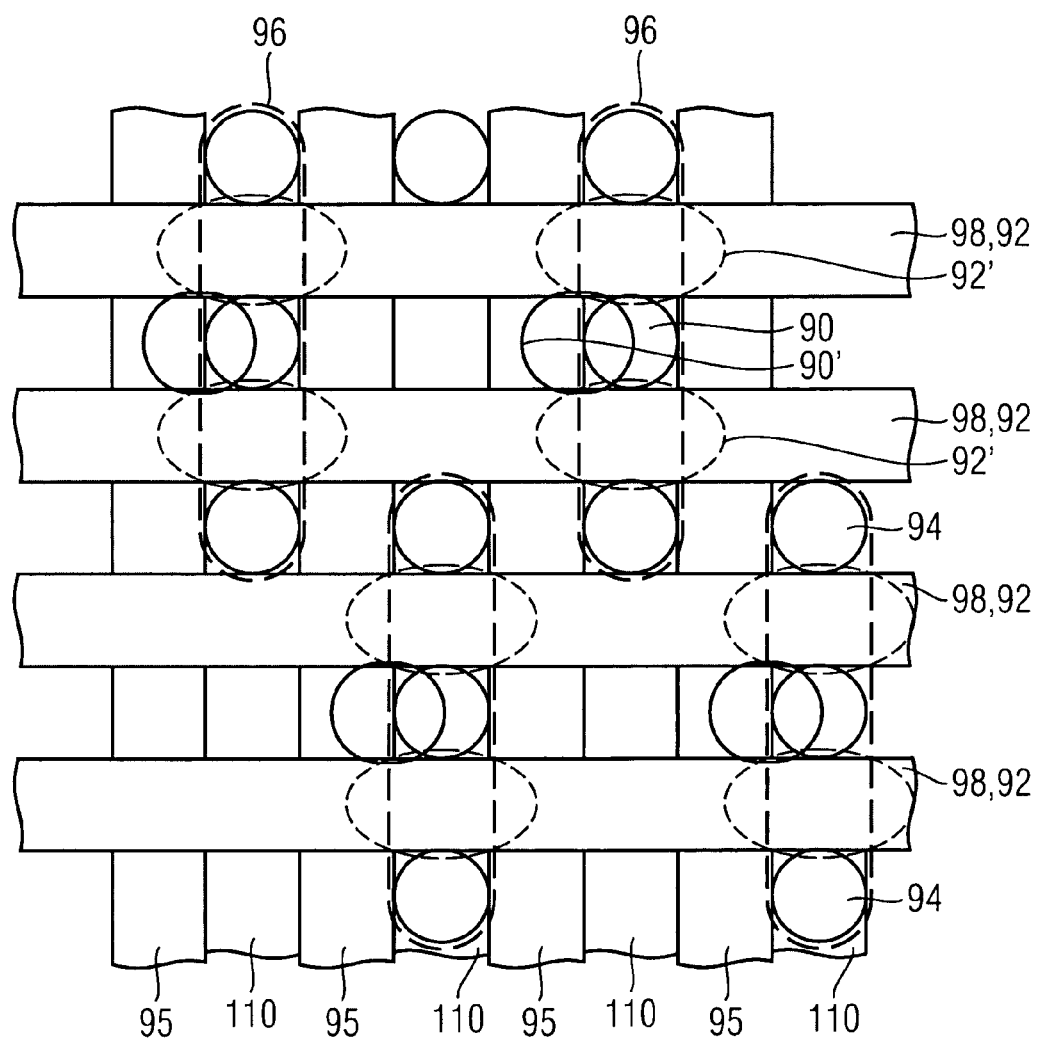
FIG. 7 illustrates a plan view of a DRAM cell array in the stack layout.

FIG. 7 illustrates, in a manner corresponding to FIG. 1, a stack of masks for the formation of a DRAM memory cell arrangement in a semiconductor substrate, which results in a plan view of a DRAM memory cell arrangement in a stack layout. In this case, the illustration shows the openings from hole masks and, from strip and lattice masks, the fin structures resulting from the respective masks.

Corresponding to openings 96 in an AA lattice mask for forming active zones (active areas, AA) of fin field effect transistors, semiconductor fins that run along cell rows 110 and are separated from one another within the same cell row 110 are formed from a semiconductor substrate. Trench insulator structures are formed between the cell rows 110 and cell insulator structures are formed between the semiconductor fins that are adjacent in each case in the same cell row 110. Corresponding to openings 92 of a gate trench mask in the region of the semiconductor fins, the semiconductor fins are in each case pulled back in two trench sections corresponding to hole mask openings 92' and gate trenches are introduced into the semiconductor fins in the process. Fin sections 98 of a word line mask are formed above the gate trenches. The word lines patterned with the word line mask run perpendicular to the cell rows 110 and alternately span semiconductor fins and cell insulator structures. Corresponding to openings 90, 94 of one or more contact masks, bit contacts are in each case arranged on outer mask sections of the semiconductor fins and a node contact is in each case arranged on an inner mask section. The node contacts will be connected via connecting structures corresponding to openings 90' of a connecting mask to bit lines corresponding to fin sections 95 of a bit line mask.

FIG. 8A to FIG. 8G illustrate, in each case to the left of the dashed line, a longitudinal section through a semiconductor fin along the cell row and, to the right of the dashed line, a cross section through the semiconductor fin transversely with respect to the cell row in different phases of an exemplary embodiment of the method according to the invention for fabricating a DRAM memory cell arrangement having CFETs in a stack layout.

A semiconductor substrate 1 is provided and a protective layer 6 is applied to a substrate surface of the semiconductor substrate 1. The protective layer 6 is provided from silicon nitride. Further layers, for instance a stress compensating layer, may be situated under the protective layer 6 (pad nitride).

In a photolithographic method, a trench lattice is introduced into the semiconductor substrate 1 through the protective layer 6. The uncovered semiconductor substrate 1 is oxidized and the trench lattice is filled with a dielectric material. The filling comprises depositing the dielectric material and removing the dielectric material deposited outside the trench lattice by planarization.

Figure 8A:
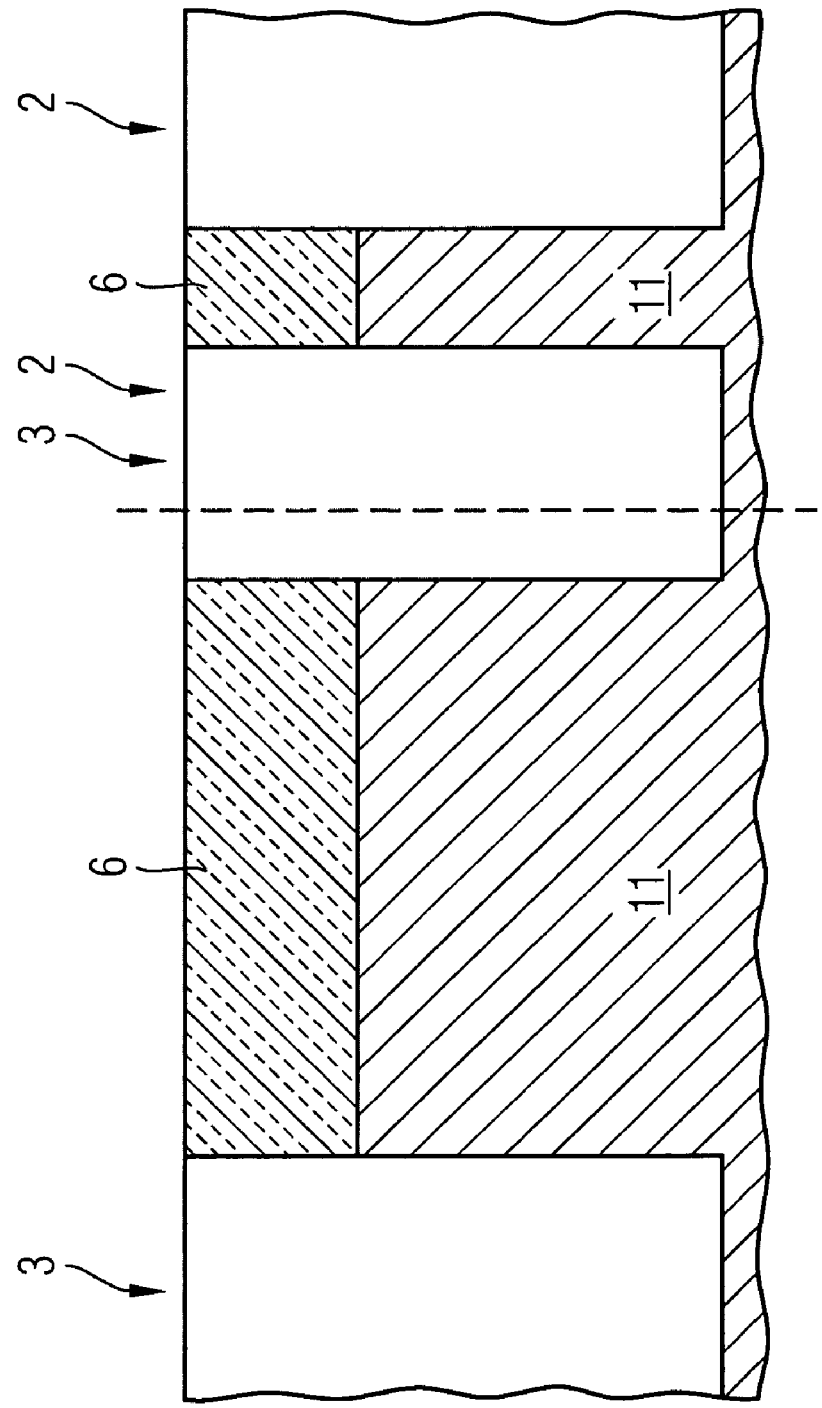
FIG. 8 illustrates a fifth exemplary embodiment of a method according to the invention with photolithographic formation of the hole mask and CFETs as fin field effect transistors in a stack layout on the basis of cross sections.

In accordance with the cross section illustrated in FIG. 8A, semiconductor fins 11 formed from the semiconductor substrate 1 along a cell row are separated by cell insulator structures 3 within the cell row and are separated from adjacent cell rows 110 by trench insulator structures 2, both the cell insulator structures 3 and the trench insulator structures 2 having been produced by filling the trench lattice with a dielectric material.

An auxiliary layer is applied to the process area formed in sections from the fields of the protective layer 6, the trench insulator structures 2 and the cell insulator structures 3 and is patterned photolithographically. In this case, striplike trenches 71' orthogonal to the cell rows 110 are formed in the auxiliary layer, which trenches cross the semiconductor fins 11 in each case over two trench sections. The patterning process is controlled in such a way that the width of the striplike trenches 71' is smaller than the respective minimum feature size F governed by the lithography. With the auxiliary mask 71 developed from the auxiliary layer in this way as an etching mask, the material of the protective layer 6 is etched back selectively with respect to the material of the trench insulator structures 2 and cell insulator structures 3 at least as far as the substrate surface.

After this etching step, in each case two trench sections of the semiconductor fins 11 are uncovered in accordance with FIG. 8B. The auxiliary mask 71 has trench openings 71', which are illustrated in cross section on the left and in longitudinal section on the right. Beneath the trench openings 71', within the fields of the protective layer 6, the inner trench sections of the semiconductor fins 11 are in each case uncovered through window openings 71". A pulling back of the trench insulator structures 2 and cell insulator structures 3 is indicated outside the fields of the protective layer 6. The trench insulator structures 2 and also the cell insulator structures 3 are provided from silicon oxide in this exemplary embodiment.

After the removal of the auxiliary mask 71, the semiconductor substrate 1 is etched in two stages in each case selectively with respect to the silicon nitride of the protective layer 6 and the silicon oxide of the trench and cell insulator structures 2, 3. Firstly, gate trenches 13 are aniostropically etched to a depth of approximately 40 nanometers into the semiconductor substrate 1. In a second step, silicon is etched isotropically in order to reliably remove silicon from the vertical sidewalls of the gate trenches 13 along the trench insulator structures 2.

Figure 8C:
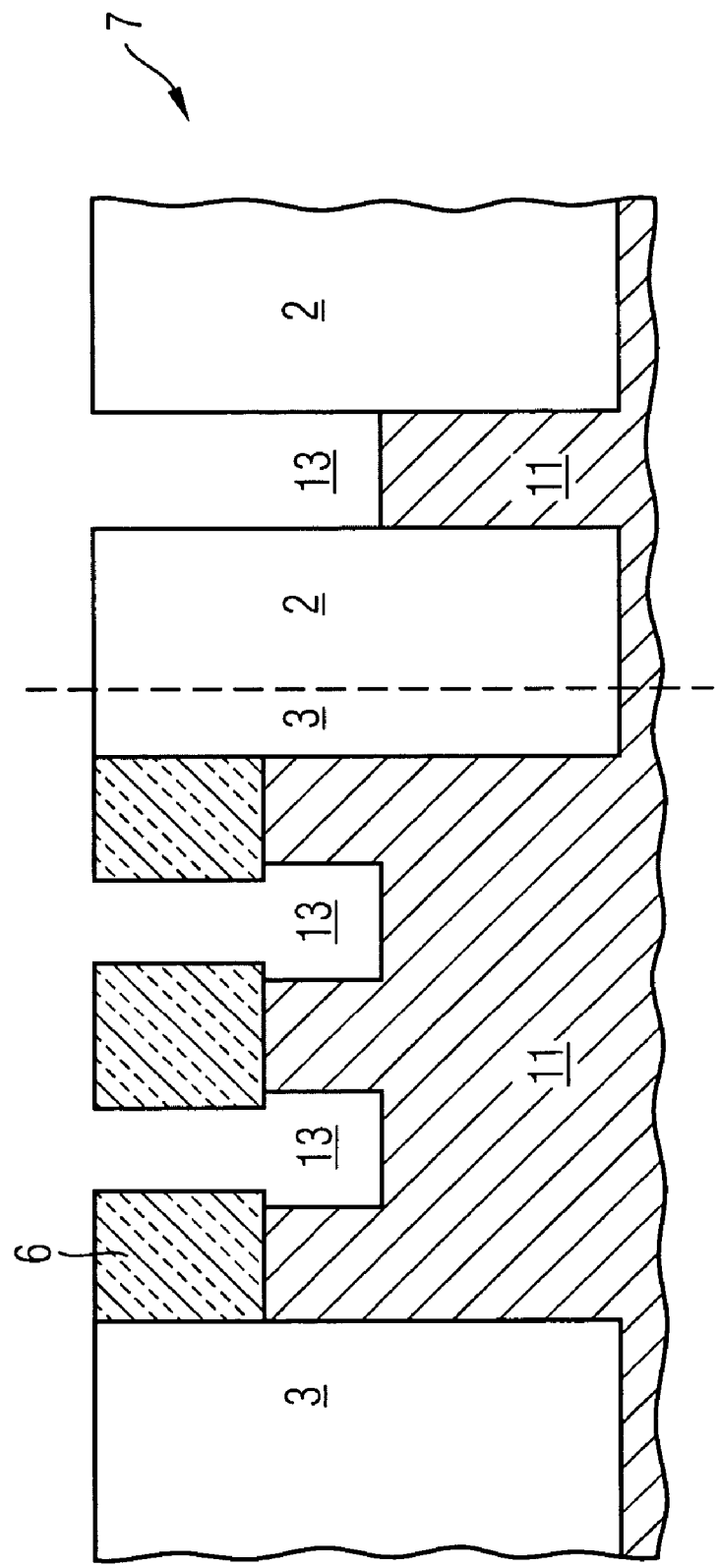

In accordance with the left-hand cross section in FIG. 8C, gate trenches 13 are in each case introduced into the two inner trench sections of the semiconductor fins 11. The gate trenches 13 are in each case bounded within the cell row by the mask sections of the semiconductor fins 11 that have not been etched back, and perpendicular to the cell row, in accordance with the right-hand cross section, by the silicon oxide of the trench insulator structures 2. On account of the isotropic etching step, the gate trenches 13 undercut the adjoining sections of the protective layer 6 by approximately 0.1 F. The width of the gate trenches 13 is accordingly approximately 0.7 F to 0.9 F. The fields of the protective layer 6 and also the silicon oxide of the trench and cell insulator structures 2, 3 form a hole mask 7.

The silicon oxide of the trench and cell insulator structures 2, 3 is pulled back isotropically by approximately 0.2 F to 0.3 F in a wet etching step.

Figure 8D:
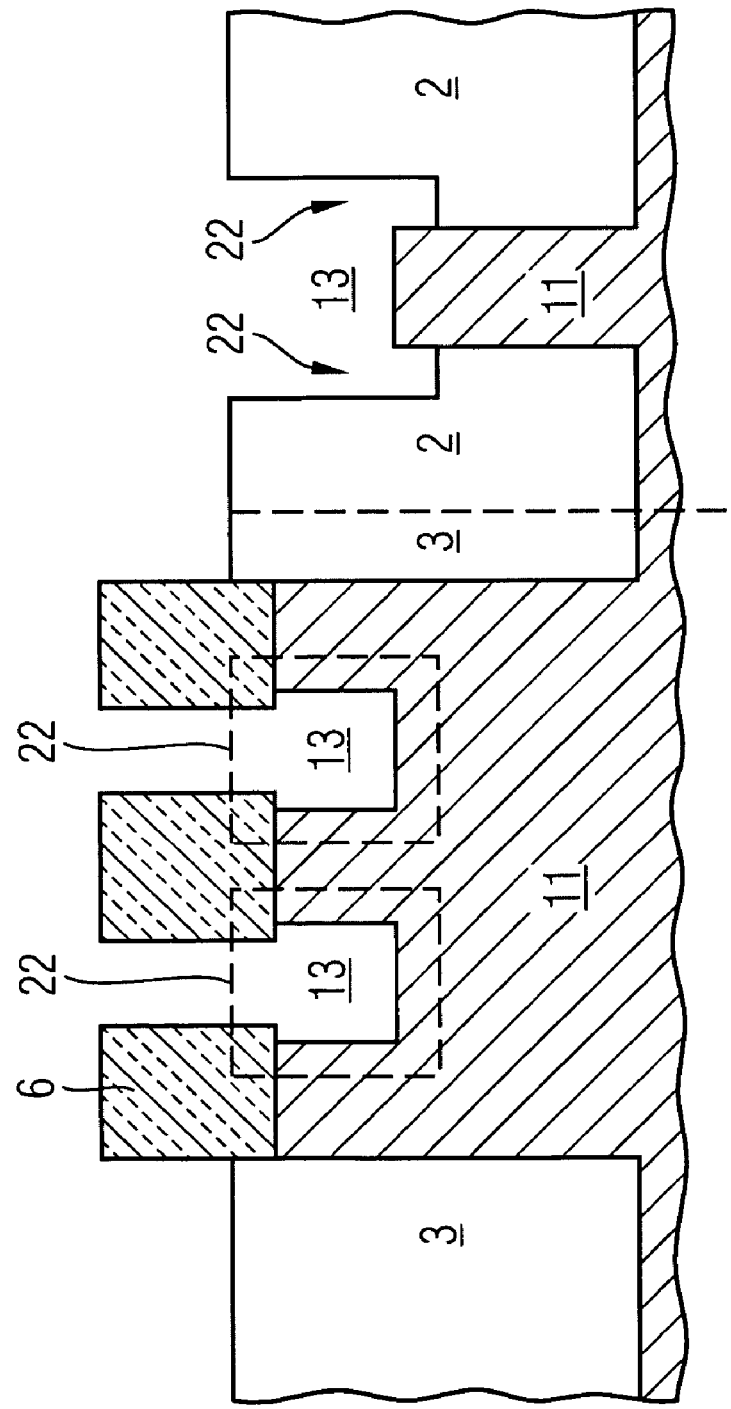

The structure illustrated in FIG. 8D is produced, in a simplified illustration. The trench insulator structures 2 and the cell insulator structures 3 are pulled back in the vertical direction by the isotropic etching. The silicon oxide is additionally pulled back from uncovered vertical sections of the silicon oxide in the horizontal direction. Vertical sections of the trench insulator structure 2 are uncovered on both sides of the gate trenches 13. The trench insulator structures 2 are thinned in the region of the gate trenches 13 in the horizontal direction. Pockets 22 in each case result on both sides of the gate trenches 13 and continue into the depth of the trench insulator structures 2 at the bottom of the respective gate trench 13.

The pockets 22 are formed in a cross section parallel to the left-hand cross-sectional line and illustrated in dashed fashion.

In the plan view, the pockets 22 extend on both sides of the gate trenches 13 along the longitudinal sides of the semiconductor fin 11 beyond the gate trenches 13.

By means of an anisotropic etching step, the silicon oxide is pulled back by a further 25 nanometers and the lower edge of the pockets 22 is driven further into the silicon in the process.

Figure 8E:
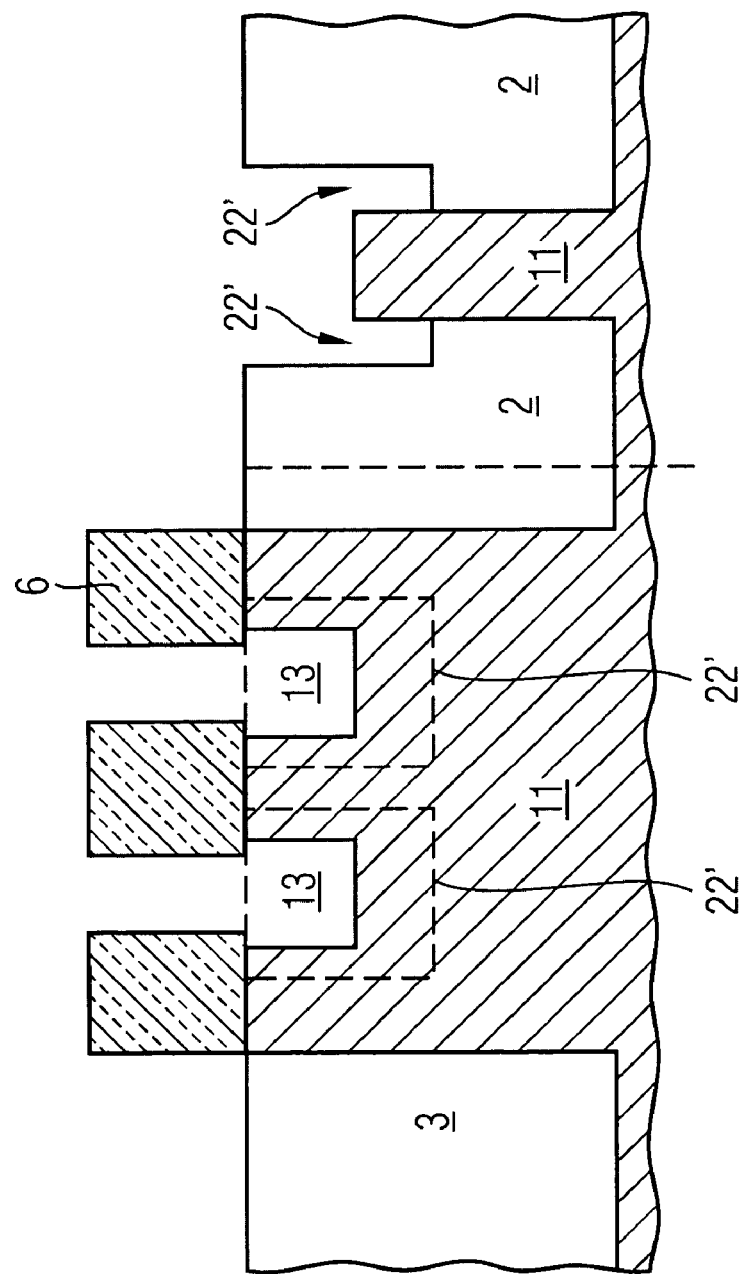

FIG. 8E illustrates the extended pockets 22'. The deepening of the pockets subsequently leads to an increase in the channel width of the CFETs formed in the semiconductor fin 11.

A sacrificial oxide is grown on the uncovered sections of the semiconductor fins 11. The protective layer 6 is completely removed. Well implantations and implantations of doped zones 126 for the formation or for preparing for the formation of source/drain regions 121, 122 in the semiconductor fins 11 are implemented, in part as oblique implantations. A gate dielectric 80 is formed on the uncovered sections of the semiconductor fins 11 for instance by oxidization of the semiconductor substrate 1 or by deposition of a dielectric material. A base layer 81 of a gate conductor layer stack is deposited, the pockets 22 being filled with the material of the base layer, for instance polysilicon.

Figure 8F:
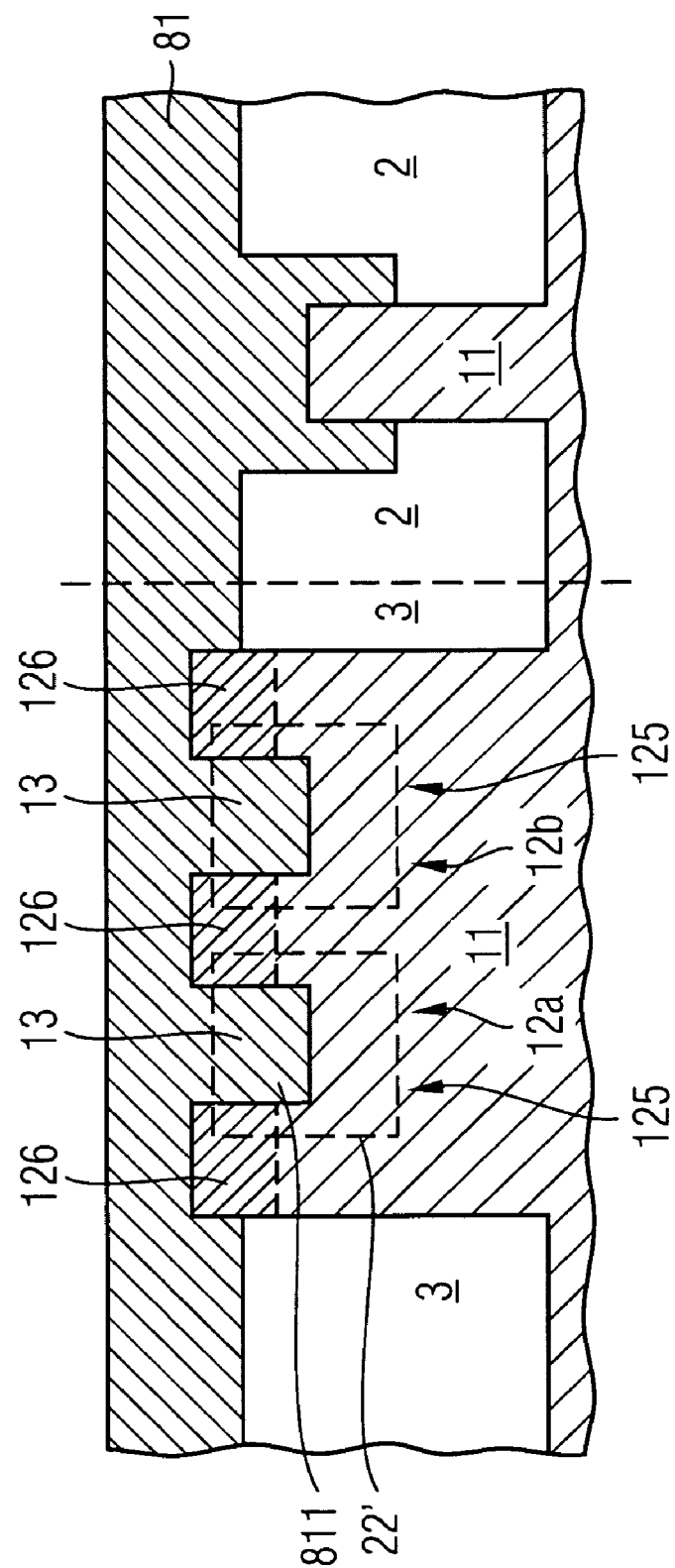

FIG. 8F illustrates the base layer 81, the buried sections of which fill the gate trenches 13 and the extended pockets 22' in the gate trench insulator structures 2.

A highly conductive layer 82, for instance having tungsten, and an insulator layer 83, for instance made of silicon nitride, of the gate conductor layer stack are deposited and the gate conductor layer stack is patterned by means of a photolithographic method to form gate conductor structures or word lines 8 running perpendicular to the cell rows above the gate trenches 13. A sidewall oxide is provided on the sidewalls of the base layer 81 and the sidewalls of the word lines 8 are covered with sidewall spacer structures 86. Optionally doped silicon is grown on the uncovered sections of the semiconductor fins 11. The growing process is controlled such that the vertical growth is higher than the horizontal growth.

Figure 8G:
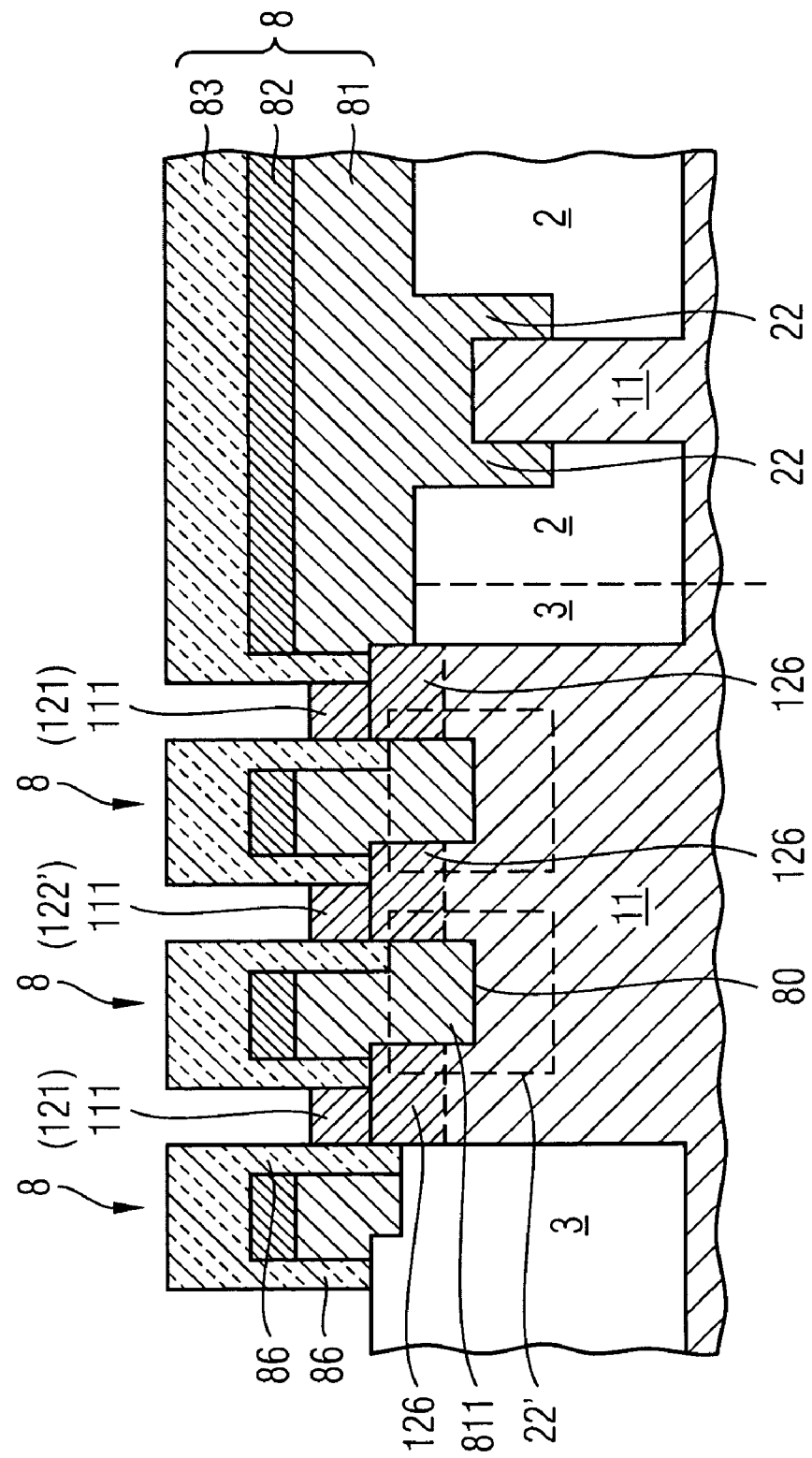

FIG. 8G illustrates a word line 8 in longitudinal section on the right and three word lines 8 in cross section on the left. The word lines 8 comprise a base layer 81 made of a conductive material, for instance doped polysilicon. Buried sections 811 of the base layer 81 fill the pockets 22 and the gate trenches 13. A highly conductive layer 82 is applied on the base layer 81 and an insulator layer 83 is applied on the highly conductive layer 82. The base layer 81 of the word line 8 is insulated from the semiconductor fin 11 by the gate dielectric 80.

The semiconductor substrate 1 includes epitaxially grown sections 111. In the left-hand semiconductor fin 11, the active zones 125 of two CFETs are formed, which in each case comprise, in the grown sections 111, a first source/drain region 121 in each case adjoining the cell insulator structure 3, and a common second source/drain region 122' in the center of the semiconductor fin 11 and also a body region 12a, 12b.

Bit contacts and node contacts for connecting the first and second source/drain regions 121, 122' to bit lines and stacked capacitors are subsequently provided. A plurality of bit contacts are in each case connected to one another by means of bit lines formed parallel to the cell rows 110. A customary BEOL process for completing a DRAM memory cell arrangement with stacked capacitors follows.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor comprising:
an active zone formed in a semiconductor fin;
a gate trench structure that is introduced from a fin surface into an inner trench section of the semiconductor fin;
two source/drain regions that are formed in each case as a doped zone in outer sections of the semiconductor fin that adjoin both sides of the gate trench structure, respectively; and
a gate electrode comprising two plate sections wherein the plate sections overlap the active zone uniformly up to an extent of at most half the width of the semiconductor fin and are connected to one another by the gate trench structure formed as trench section of the gate electrode.

2. An array of transistors as claimed in claim 1 that are arranged in each case in cell rows comprising:
in each case precisely one field effect transistor is formed in the semiconductor fins;
the cell rows are spaced apart from one another by a trench insulator structure in each case; and
mutually adjacent cell rows are formed in a manner offset by in each case half a cell length with respect to one another,
the gate electrodes of cell rows that are not formed in an offset manner with respect to one another are formed as sections of word lines running perpendicular to the cell rows.

3. An array of transistors for DRAM memory cell arrangements comprising:
having a plurality of field effect transistors as claimed in claim 1 that are arranged in each case in cell rows, wherein in each case two field effect transistors are formed in a mirror-inverted fashion with respect to one another in the semiconductor fins and in this case a first source/drain region of one field effect transistor and a second source/drain region of the other field effect transistor are provided as a single doped zone;
the cell rows are spaced apart from one another by a trench insulator structure in each case; and
the gate electrodes are formed as sections of word lines running perpendicular to the cell rows.

4. The array of transistors as claimed in claim 3, wherein mutually adjacent cell rows are formed in a manner offset by in each case half a cell length with respect to one another and the word lines are formed in section in each case by the gate electrodes of cell rows that are not formed in an offset manner with respect to one another.

5. The transistor of claim 1, wherein the plate sections are disposed in a self-aligned manner with respect to the gate trench structure.

6. The transistor of claim 1, wherein the plate sections are made of polysilicon.

7. A DRAM memory cell comprising a transistor including:
an active zone formed in a semiconductor fin;
a gate trench structure that is introduced from a fin surface into an inner trench section of the semiconductor fin;
two source/drain regions that are formed in each case as a doped zone in outer sections of the semiconductor fin that adjoin both sides of the gate trench structure, respectively; and a gate electrode comprising two plate sections, wherein the plate sections extend to below a lower edge of the gate trench structure up to a depth of at most half the width of the semiconductor fin and are connected to one another by the gate trench structure formed as trench section of the gate electrode.

8. The memory cell of claim 7, having a plurality of field effect transistors that are arranged in cell rows comprising:

in each case precisely one field effect transistor is formed in the semiconductor fins;

the cell rows are spaced apart from one another by a trench insulator structure in each case; and mutually adjacent cell rows are formed in a manner offset by in each case half a cell length with respect to one another, the gate electrodes of cell rows that are not formed in an offset manner with respect to one another are formed as sections of word lines running perpendicular to the cell rows.

9. A DRAM memory cell arrangement comprising, a transistor comprising:

an active zone formed in a semiconductor fin;

a gate trench structure that is introduced from a fin surface into an inner trench section of the semiconductor fin;

two source/drain regions that are formed as doped zones in outer sections of the semiconductor fin that adjoin both sides of the gate trench structure, respectively; and a gate electrode comprising two plate sections, wherein the plate sections extend to below a lower edge of the gate trench structure up to a depth of at most half the width of the semiconductor fin and are connected to one another by the gate trench structure formed as trench section of the gate electrode.

10. A transistor comprising:

an active zone formed in a semiconductor fin;

a gate electrode; and two source/drain regions that are formed as a doped zone in outer sections of the semiconductor fin that adjoin both sides of the gate electrode, respectively, wherein the gate electrode comprises two plate sections that extend to below a lower edge of an upper side of the semiconductor fin up to a depth of at most half the width of the semiconductor fin.

11. The transistor of claim 10, wherein the plate sections are made of polysilicon.

* * * * *